US012371329B2

United States Patent
Saito

(10) Patent No.: US 12,371,329 B2
(45) Date of Patent: Jul. 29, 2025

(54) HETEROELEMENT-CONTAINING GRAPHENE

(71) Applicant: Japan Science and Technology Agency, Kawaguchi (JP)

(72) Inventor: Nagahiro Saito, Nagoya (JP)

(73) Assignee: Japan Science and Technology Agency, Kawaguchi (JP)

( * ) Notice: Subject to any disclaimer, the term of this patent is extended or adjusted under 35 U.S.C. 154(b) by 888 days.

(21) Appl. No.: 16/650,964

(22) PCT Filed: Sep. 28, 2018

(86) PCT No.: PCT/JP2018/036399
§ 371 (c)(1),
(2) Date: Jul. 17, 2020

(87) PCT Pub. No.: WO2019/066013
PCT Pub. Date: Apr. 4, 2019

(65) Prior Publication Data
US 2020/0346933 A1    Nov. 5, 2020

(30) Foreign Application Priority Data

Sep. 29, 2017   (JP) ................... 2017-190683

(51) Int. Cl.
*C01B 32/182*    (2017.01)
*C01B 32/194*    (2017.01)
(Continued)

(52) U.S. Cl.
CPC ............. *C01B 32/194* (2017.08); *C30B 7/14* (2013.01); *C30B 29/02* (2013.01);
(Continued)

(58) Field of Classification Search
CPC ............. C01B 32/194; C01B 2204/04; C01B 2204/22; C30B 7/14; C30B 29/02;
(Continued)

(56) References Cited

U.S. PATENT DOCUMENTS

| 10,252,253 B2 | 4/2019 | Miyajima et al. |
| 2013/0181165 A1* | 7/2013 | Tetsuka ................. C01B 32/194 564/426 |

(Continued)

FOREIGN PATENT DOCUMENTS

| CN | 102605339 A | 7/2012 |
| CN | 102953118 A | 3/2013 |

(Continued)

OTHER PUBLICATIONS

Three-dimensional B,N-doped graphene foam as a metal-free catalyst for oxygen reduction reaction, Xue et al., Chem. Phys., 2013, 15, 12220-12226.*

(Continued)

*Primary Examiner* — Haidung D Nguyen
(74) *Attorney, Agent, or Firm* — The Webb Law Firm

(57) ABSTRACT

Provided is a highly crystalline heteroelement-containing graphene including carbon (C) and, as a heteroelement (X), at least one element selected from the group consisting of nitrogen (N), phosphorus (P), arsenic (As), sulfur (S), boron (B), and silicon (Si). Also, spots belonging to either the orthorhombic system or the hexagonal system and having the symmetry of a single crystal are observed in the selected area electron diffraction.

15 Claims, 10 Drawing Sheets

(51) Int. Cl.
*C30B 7/14* (2006.01)
*C30B 29/02* (2006.01)

(52) U.S. Cl.
CPC ...... *C01B 2204/04* (2013.01); *C01B 2204/22* (2013.01); *C01P 2002/52* (2013.01); *C01P 2002/72* (2013.01); *C01P 2002/74* (2013.01); *C01P 2002/76* (2013.01); *C01P 2002/77* (2013.01); *C01P 2002/78* (2013.01); *C01P 2002/82* (2013.01); *C01P 2002/85* (2013.01); *C01P 2004/04* (2013.01); *C01P 2004/61* (2013.01); *C01P 2004/62* (2013.01); *C01P 2004/64* (2013.01)

(58) Field of Classification Search
CPC .............. C01P 2002/52; C01P 2002/72; C01P 2002/74; C01P 2002/76; C01P 2002/77; C01P 2002/78; C01P 2002/82; C01P 2002/85; C01P 2004/04; C01P 2004/61; C01P 2004/62; C01P 2004/64
See application file for complete search history.

(56) References Cited

U.S. PATENT DOCUMENTS

| | | |
|---|---|---|
| 2013/0288155 A1 | 10/2013 | Kim et al. |
| 2014/0353144 A1 | 12/2014 | Nakanishi et al. |
| 2015/0236353 A1 | 8/2015 | Meunier et al. |
| 2015/0352539 A1 | 12/2015 | Miyajima et al. |

FOREIGN PATENT DOCUMENTS

| | | |
|---|---|---|
| CN | 103974900 A | 8/2014 |
| CN | 104630894 A | 5/2015 |
| CN | 105067586 A | 11/2015 |
| CN | 106206682 A | 12/2016 |
| CN | 106256761 A | 12/2016 |
| JP | 2012153555 A | 8/2012 |
| JP | 2013232409 A | 11/2013 |
| JP | 2014100617 A | 6/2014 |
| JP | 2016209798 A | 12/2016 |
| WO | 2014098251 A | 6/2014 |

OTHER PUBLICATIONS

Bifunctional Electrocatalytic Activity of Boron-Doped Graphene Derived from Boron Carbide, Vineesh et al., Adv. Energy Mater. 2015, 5, 1500658.*
Low Temperature Growth of Highly Nitrogen-Doped Single Crystal Graphene Arrays by Chemical Vapor Deposition, Xue et al., J. Am. Chem. Soc. 2012, 134, 11060-11063 and Supplemental Information.*
Nitrogen-doping processes of graphene by a versatile plasma-based method, Lin et al., C A R B O N 73 (2014) 216-224.*
Facile Synthesis and Characterization of Graphene Nanosheets, Wang et al., J. Phys. Chem. C 2008, 112, 8192-8195.*
Hyun, Koangyong et al., "The solution plasma process for heteroatomcarbon nanosheets: the role of precursors", Scientific Reports, Jun. 19, 2017, pp. 1-9, vol. 7, No. 1.
Tang, Li-bin et al., Progress in the Tuning Techniques of Energy Band for Graphene Based Materials, Infrared Technology, Nov. 2015, pp. 897-905, vol. 37, No. 11.
Tsai et al., "Nitrogen-doped graphene nanosheet-supported non-precious iron nitride nanoparticles as an efficient electrocatalyst for oxygen reduction", RSC Advances, Oct. 7, 2011, pp. 1349-1357, vol. 1, No. 7, DOI: 10.1039/c1ra00373a.
Wu et al., "Enhanced methanol electro-oxidation activity of PtRu catalysts supported on heteroatom-doped carbon", Electrochimica Acta, Nov. 1, 2008, pp. 7622-7629, vol. 53, No. 26, DOI: 10.1016/j.electacta.2008.03.082.

* cited by examiner

[Figure 1]
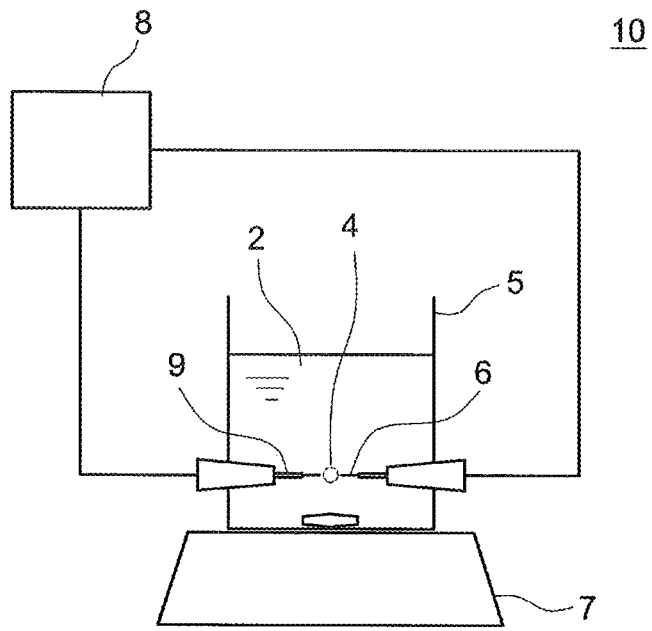
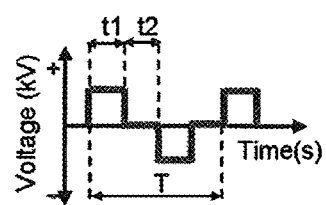
BIPOLAR PULSE POWER SUPPLY

[Figure 2]
(a) DMF
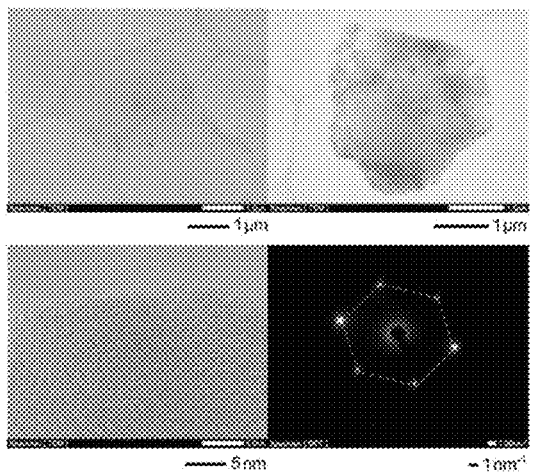
(b) Acetonitrile
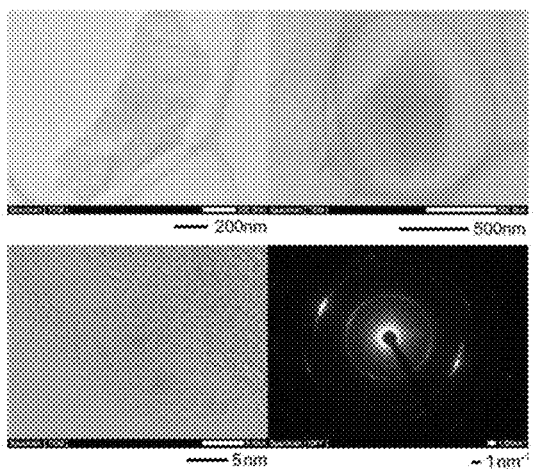
(c) Benzene
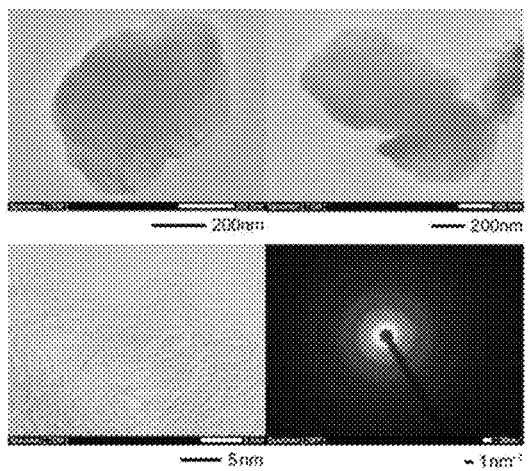
(d) Toluene
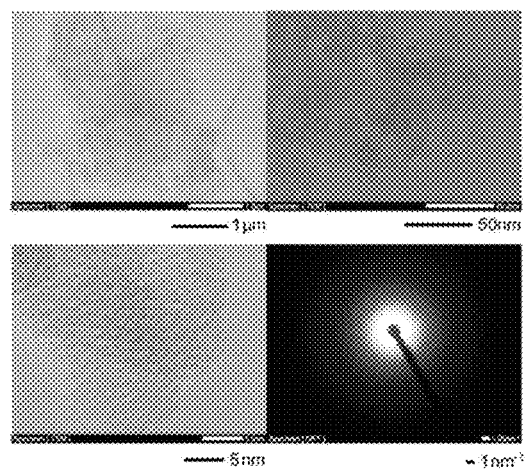

[Figure 3]
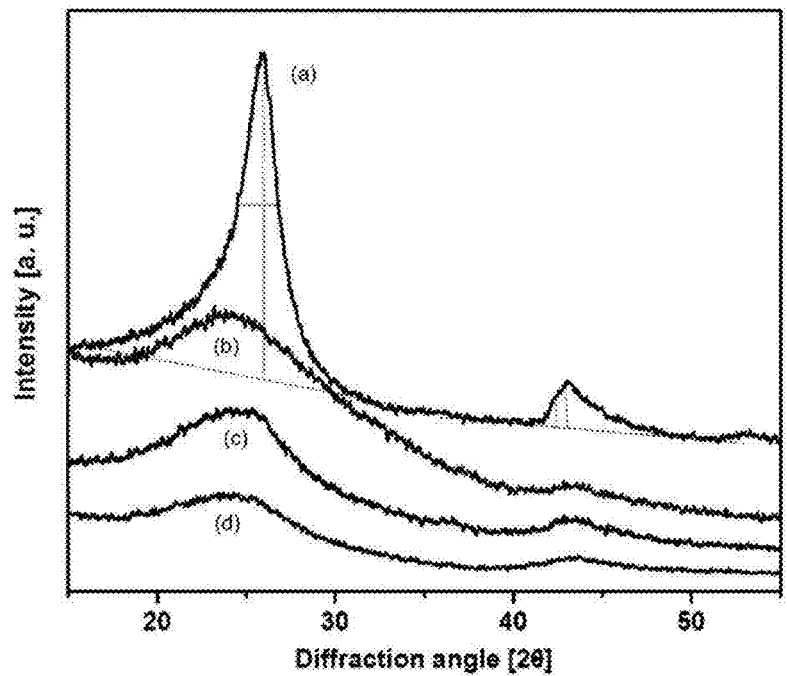
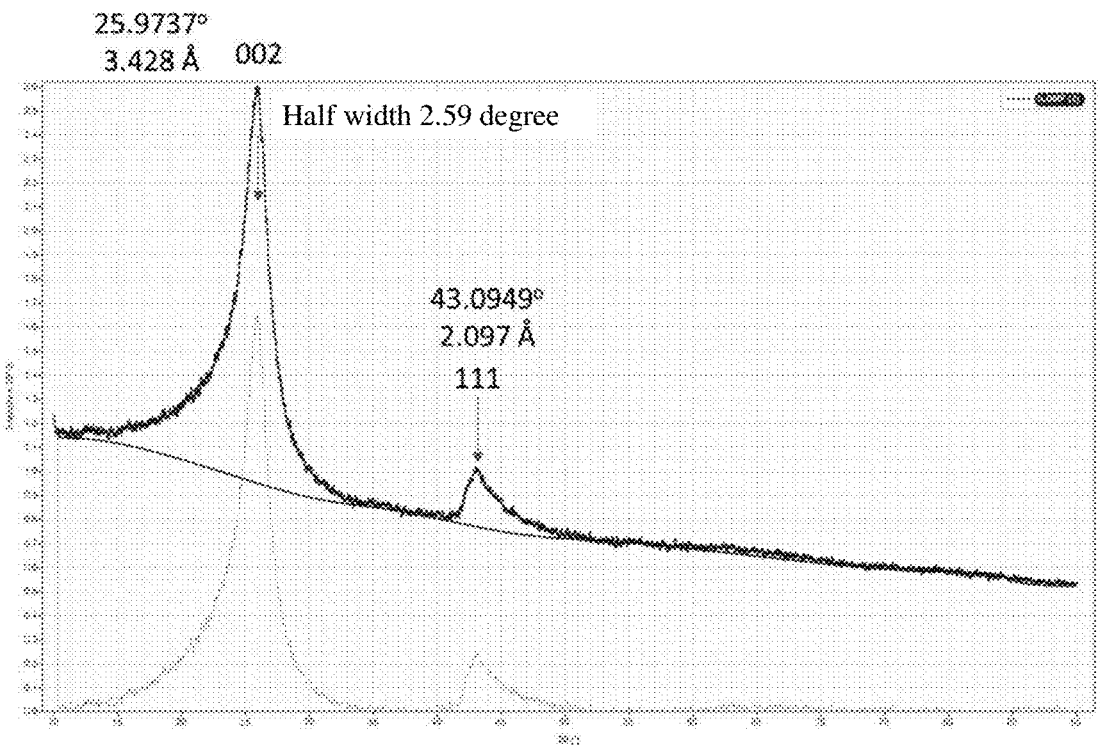

[Figure 4A]
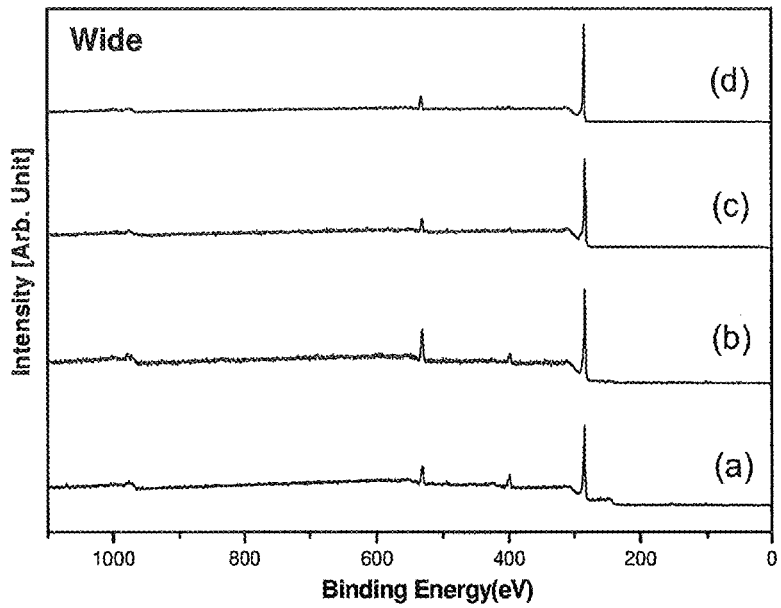
[Figure 4B]
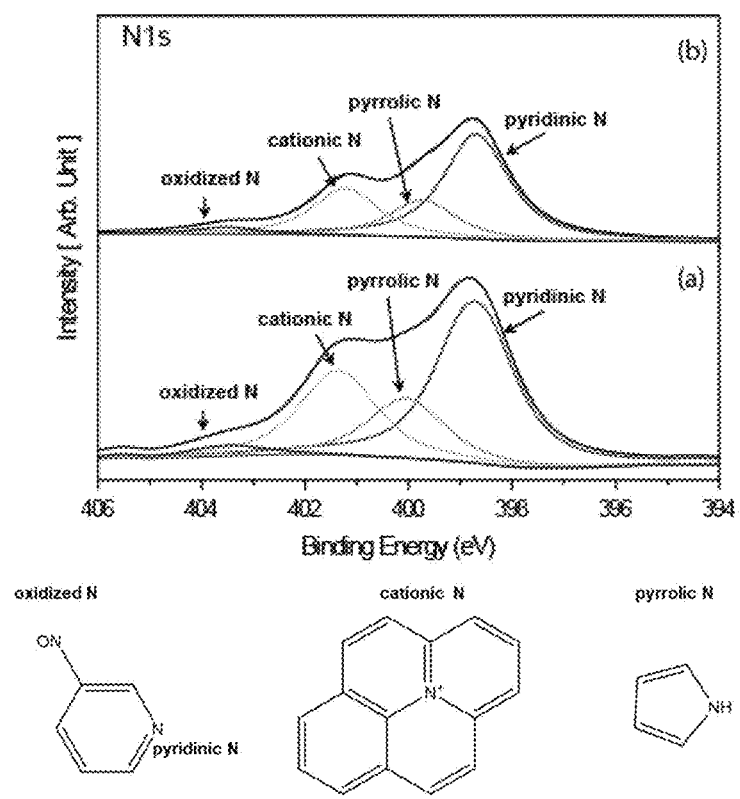

[Figure 5]
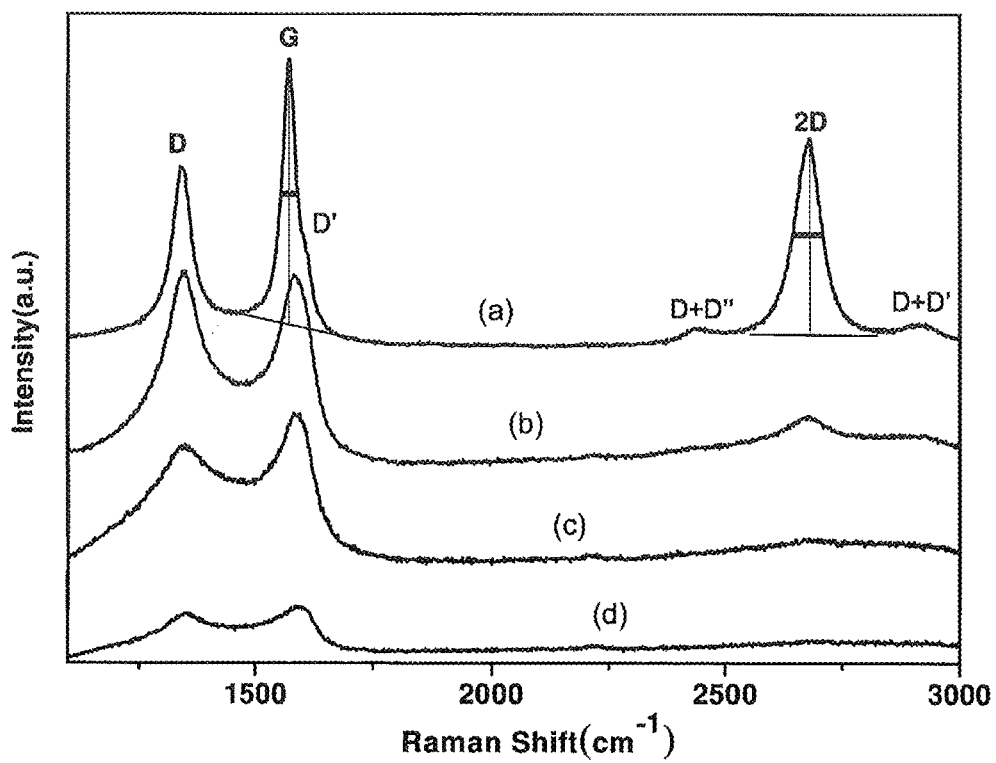

[Figure 6]
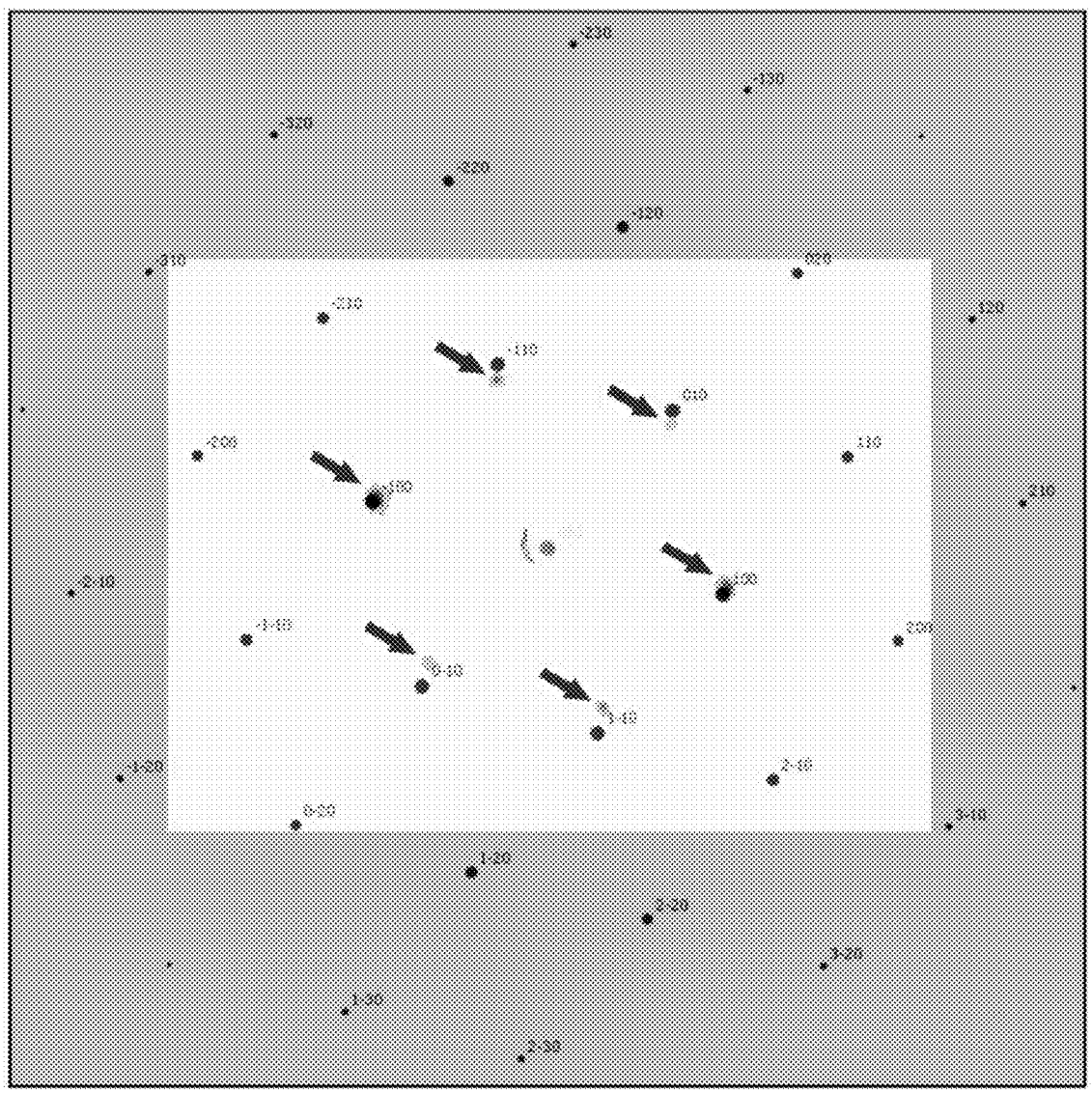

[Figure 7]
(a)
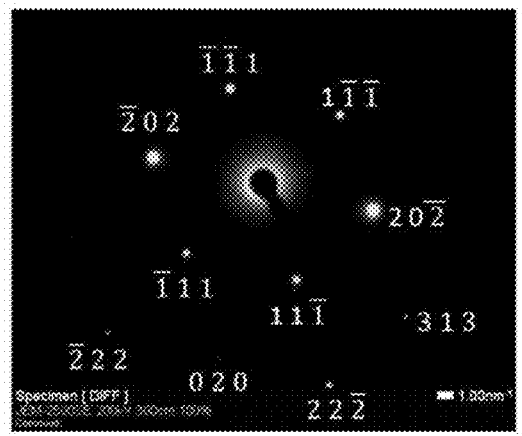
(b)
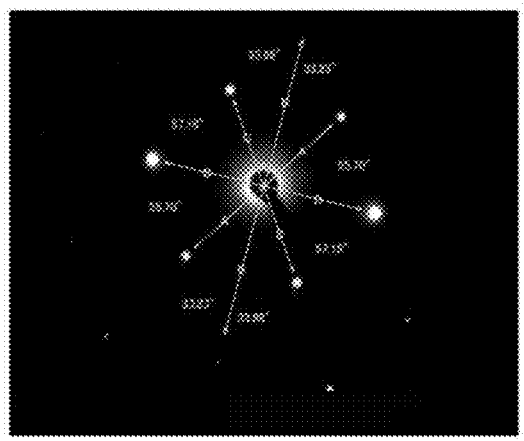
(c)
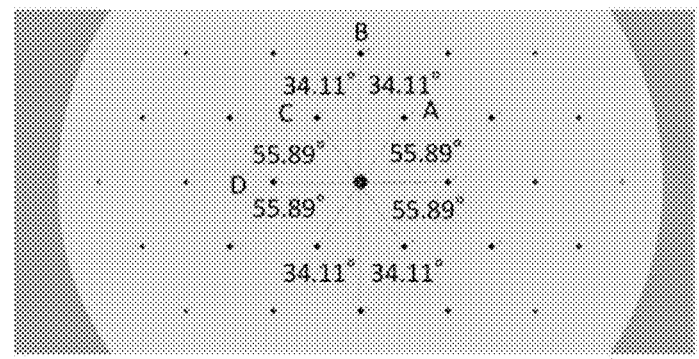

[Figure 8]
Hall effect measurement (semiconductor characteristics): temperature dependence
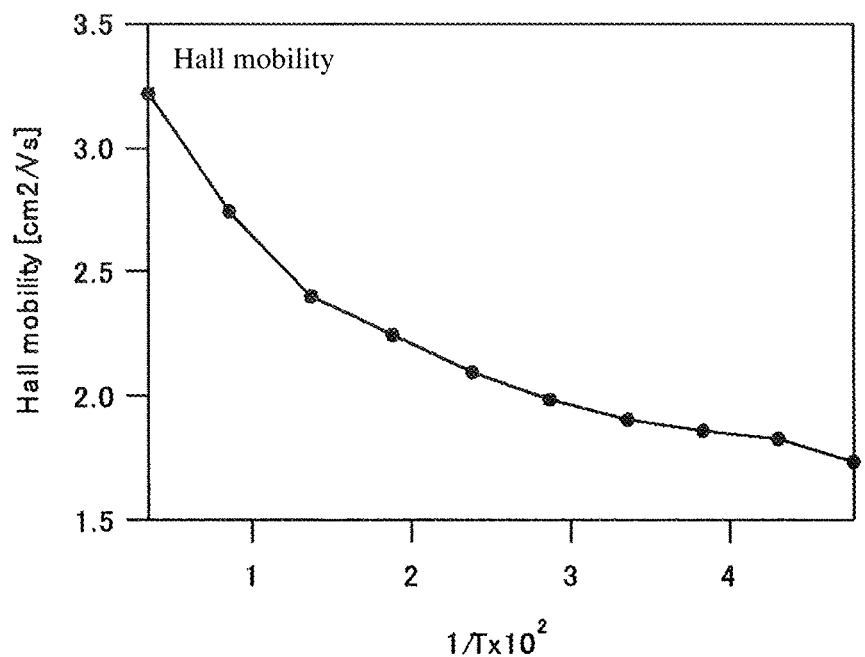

[Figure 9]
Hall effect measurement (semiconductor characteristics): temperature dependence
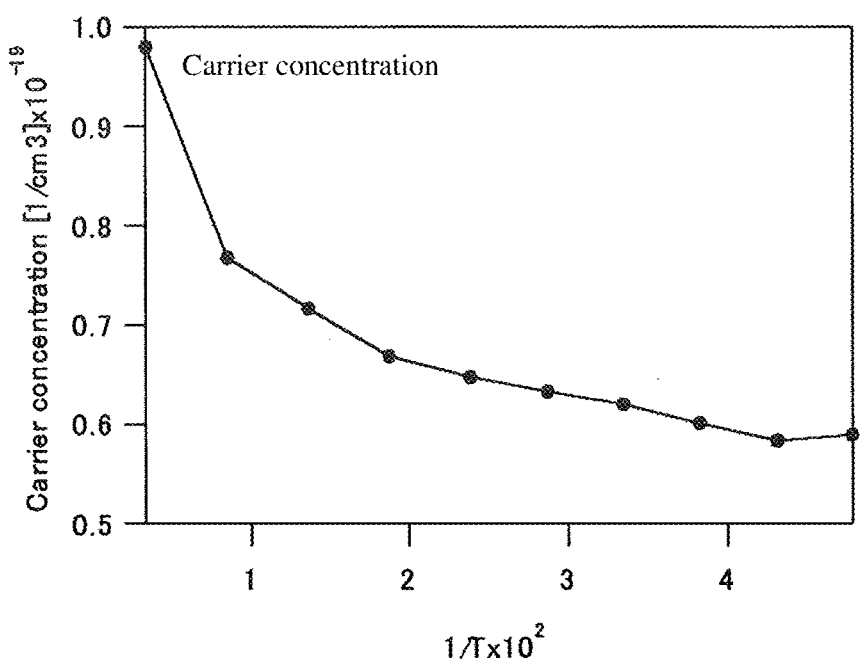

[Figure 10]
Hall effect measurement (semiconductor characteristics): temperature dependence
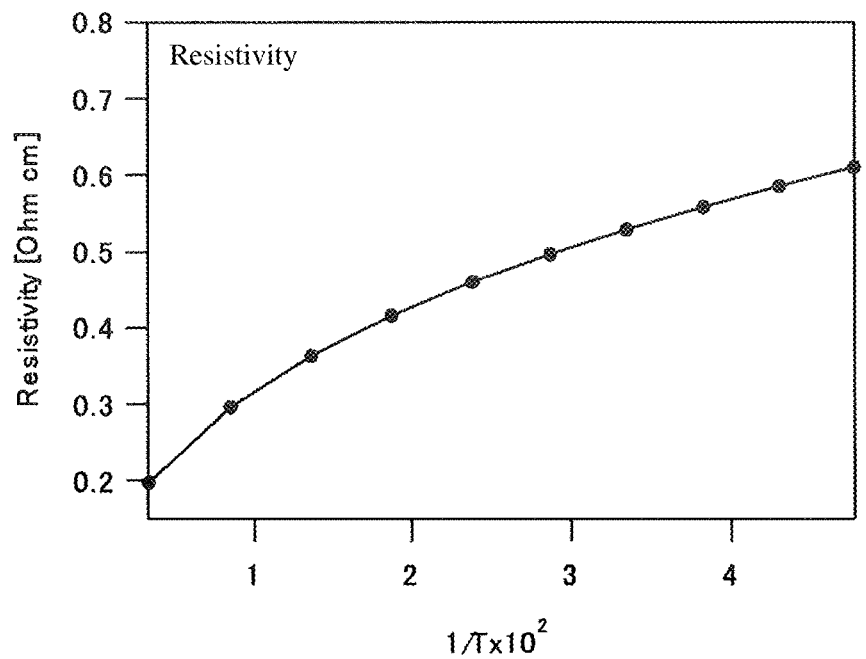
[Figure 11]
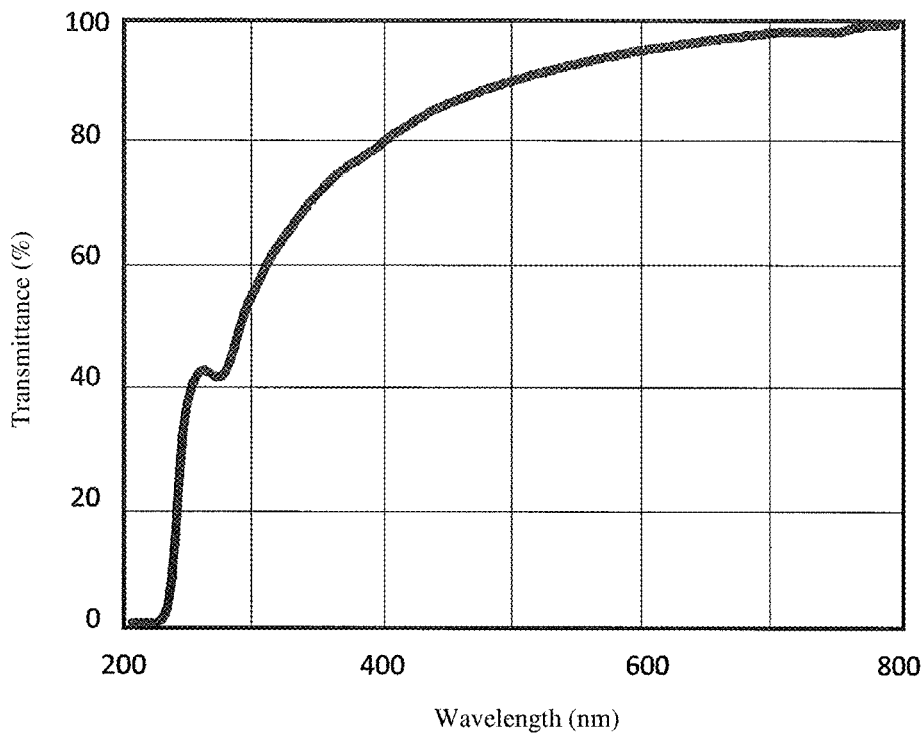

HETEROELEMENT-CONTAINING GRAPHENE

CROSS-REFERENCE TO RELATED APPLICATIONS

This application is the United States national phase of International Application No. PCT/JP2018/036399 filed Sep. 28, 2018, and claims priority to Japanese Patent Application No. 2017-190683 filed Sep. 29, 2017, the disclosures of which are hereby incorporated by reference in their entirety.

TECHNICAL FIELD

The present invention relates to a heteroelement-containing graphene having a flat shape and exhibiting properties as a transparent P-type semiconductor.

BACKGROUND ART

Heteroelement-containing graphene in which heterogeneous elements other than carbon are introduced into the carbon six-membered ring structure of graphene has attracted attention. In the heteroelement-containing graphene, for example, when a heterogeneous element such as nitrogen is introduced into the valley portion of the zigzag edge of the graphene, the heterogeneous element acts physically and chemically on the adjacent carbon atoms. It is known that the adjacent carbon atoms develop oxygen reduction properties as a result. Therefore, utilization of heteroelement-containing graphene as a catalyst material has been studied (see, for example, Japanese Patent Laid-Open No. 2013-232409, Japanese Patent Laid-Open No. 2012-153555, and International Publication No. WO 2014/098251).

Japanese Patent Laid-Open No. 2013-232409 discloses an electrode catalyst support in which nitrogen-containing graphite is formed on a surface of a carbon support. The nitrogen-containing graphite of Japanese Patent Laid-Open No. 2013-232409 is formed on a surface of a carbon support which has n electron donor properties. Japanese Patent Laid-Open No. 2013-232409 further discloses that when the crystallinity of the nitrogen-containing graphite is evaluated by the ID/IG value based on the Raman spectrum, the ID/IG value is allowed to be 0.8 to 1.2.

Japanese Patent Laid-Open No. 2012-153555 discloses a heteroatom-containing graphene containing a heteroatom such as nitrogen, which can be synthesized by a solvothermal reaction. In the Examples of Japanese Patent Laid-Open No. 2012-153555, it is described that the heteroatom-containing graphene is doped with nitrogen atoms in a ratio of 14.8 atomic %. However, Japanese Patent Laid-Open No. 2012-153555 does not disclose anything about the crystallinity of the heteroatom-containing graphene.

International Publication No. WO 2014/098251 discloses graphite-like carbon nitride ($g$-$C_3N_4$) having a stoichiometric ratio. The graphite-like carbon nitride disclosed in International Publication No. WO 2014/098251 has a structure in which melon (($C_6N_9H_3$)X), which has a triangular crystal structure in which three 6-membered rings formed by nitrogen and carbon and sharing C—N bonds with each other, is polymerized through nitrogen atoms at its apexes.

In Japanese Patent Laid-Open No. 2014-100617, the present inventors provide a method for producing a heteroatom-containing carbon catalyst containing a large amount of nitrogen of 10 atomic % or more as a heterogeneous element. According to these methods, heteroatom-containing graphene containing no support can be produced.

Furthermore, Japanese Patent Laid-Open No. 2016-209798 discloses that a redox-active carbon catalyst is formed on an electrode.

In the heteroatom-containing graphene obtained in Japanese Patent Laid-Open No. 2012-153555 and Japanese Patent Laid-Open No. 2014-1006174, actually, the doping position of the heteroatoms on the graphene sheet tends to be biased toward the sheet edge (edge). Also, there is a problem in that even when the doping inside (in-plane) of the graphene sheet is allowed to be performed, the bonding angle between carbon and heteroatoms is disordered as the amount of nitrogen to be doped increases, so that the flatness of the graphene sheet is unable to be maintained. In other words, the graphene sheet doped with nitrogen atoms is not returned to the flat shape staying curved at the atomic level, so that a nitrogen-containing carbon catalyst having good crystallinity in terms of crystallography cannot be obtained. In view of the above problems, an object of the present invention is to provide a transparent and highly crystalline heteroelement-containing graphene that maintains the flatness of a graphene sheet even when the amount of nitrogen to be doped is increased.

SUMMARY OF INVENTION

Crystalline graphite and graphene belong to the hexagonal system and may have a flat crystal structure formed by a six-membered ring structure. However, in the heteroelement-containing graphene in which a heteroelement is introduced into graphene, distortion may occur at the bonding site between carbon and heteroelement in the crystal structure. As a result, even if the heteroelement-containing graphene appears to have a sheet-like form, the crystal structure may have reduced symmetry, or the heteroelement-containing graphene may be in an amorphous form instead of crystal. In other words, in the conventional heteroelement-containing graphene, no long-range order is observed in the crystal structure. This tendency becomes more prominent as the amount of the heteroelement introduced increases. As a result, in the conventional heteroelement-containing graphene, for example, spots having the symmetry of a single crystal are not observed in selected area electron diffraction. On the contrary, when the heteroelement-containing graphene disclosed herein is subjected to the selected area electron diffraction, spots having the symmetry of a single crystal belonging to either the orthorhombic system or the hexagonal system are observed, for example. In other words, the present inventors have succeeded for the first time in creating heteroelement-containing graphene having high crystallinity in terms of crystallography (hereinafter sometimes simply referred to as "highly crystalline heteroelement-containing graphene"). Thereby, highly crystalline heteroelement-containing graphene is provided.

In the prior art, when the amount of nitrogen to be doped is increased, highly crystalline hetero-containing graphene in which the flatness of the graphene sheet is maintained cannot be obtained. The present inventors have produced a heteroelement-containing graphene using a specific producing method and have found that a heteroelement-containing graphene in which nitrogen having four valence electrons (cationic nitrogen) is doped on the basal plane is allowed to be produced and the heteroelement-containing graphene thus produced has high crystallinity in terms of crystallography, and is transparent and has flatness, thereby completing the present invention. That is, the present inventors have succeeded for the first time in creating a heteroelement-containing graphene having high crystallinity in terms of crystallography (hereinafter sometimes simply referred to as "highly crystalline heteroelement-containing graphene").

The present invention is, for example, as shown in the following (1) to (13):

(1) A heteroelement-containing graphene comprising carbon (C) and, as a heteroelement (X), at least one element selected from the group consisting of nitrogen (N), phosphorus (P), arsenic (As), sulfur (S), boron (B), and silicon (Si), wherein spots belonging to either an orthorhombic system or a hexagonal system and having a symmetry of a single crystal are observed in selected area electron diffraction.

The heteroelement (X) is more preferably at least one element selected from N and B.

(2) The heteroelement-containing graphene according to (1), in which the spots form an electron diffraction image belonging to the orthorhombic system with an incident direction of [101], the spots including an array of reciprocal lattice points 11-1, −111, −202, 1-1-1, 20-2, and −1-11.

(3) The heteroelement-containing graphene according to (1) or (2), in which a half width of a diffraction peak from (002) planes is 3 degrees or less in X-ray diffraction.

(4) The heteroelement-containing graphene according to any one of (1) to (3), in which a ratio (I(101)/I(002)) of a diffraction peak intensity I(101) from (101) planes to a diffraction peak intensity I(002) from (002) planes is 0.1 or more in X-ray diffraction.

(5) The heteroelement-containing graphene according to (3) or (4), in which an interplanar spacing between the (002) planes is 3.5 Å or less in X-ray diffraction.

(6) The heteroelement-containing graphene according to any one of (1) to (5), in which an atomic ratio (X/C) of the heteroelement (X) to carbon (C), calculated based on X-ray photoelectron spectroscopy, is 0.1 or more.

(7) The heteroelement-containing graphene according to any one of (1) to (6), in which a possibility of a chemical bonding state of nitrogen doped to a basal plane being a chemical bonding state of cationic nitrogen can be indicated based on X-ray photoelectron spectroscopy, and it is determined by Hall effect measurement that a carrier type of the heteroelement-containing graphene is p-type.

(8) The heteroelement-containing graphene according to any one of (1) to (7), in which a ratio (I(D)/I(G)) of an intensity I(D) of a D band seen in the vicinity of 1350 $cm^{-1}$ to an intensity I(G) of a G band appearing in the vicinity of 1580 $cm^{-1}$ is 1 or less and a half width of the G band is 50 $cm^{-1}$ or less in Raman spectroscopic analysis with an excitation wavelength of 532 nm.

(9) The heteroelement-containing graphene according to any one of (1) to (8), in which a ratio (I(2D)/I(G)) of an intensity I(2D) of a 2D band seen in the vicinity of 2700 $cm^{-1}$ to the intensity I(G) of the G band is 0.5 or more in the Raman spectroscopic analysis.

(10) The heteroelement-containing graphene according to any one of (1) to (9), in which a half width of the 2D band seen in the vicinity of 2700 $cm^{-1}$ is 80 $cm^{-1}$ or less in the Raman spectroscopic analysis.

(11) The heteroelement-containing graphene according to any one of (1) to (10), which does not include a base material that supports the heteroelement-containing graphene.

(12) The heteroelement-containing graphene according to any one of (1) to (11), comprising a graphene sheet configured such that atoms of the carbon (C) are chemically bonded to atoms of the heteroelement (X) and atoms of the carbon (C) are principally $sp^2$-bonded to each other, wherein the graphene sheet has a single-layer structure formed by one layer or a stacked structure of two or more and five or less layers.

(13) The heteroelement-containing graphene according to any one of (1) to (12), which is a powder having an average particle size of 1 nm or more and 10 μm or less.

(14) A method for producing a heteroelement-containing graphene comprising carbon (C) and, as a heteroelement (X), at least one element selected from the group consisting of nitrogen (N), phosphorus (P), arsenic (As), sulfur (S), boron (B), and silicon (Si), wherein spots belonging to either an orthorhombic system or a hexagonal system and having a symmetry of a single crystal are observed in selected area electron diffraction, the method comprising:

dissolving a hetero 5-membered ring compound having, at least partially, a 5-membered ring structure in a polar aprotic solvent to prepare a raw material-containing liquid, wherein the 5-membered ring is formed by carbon (C) and the heteroelement (X) which is at least one selected from the group consisting of nitrogen (N), phosphorus (P), arsenic (As), sulfur (S), boron (B), and silicon (Si); and generating plasma in the raw material-containing liquid to polymerize the hetero 5-membered ring compound, thereby obtaining the heteroelement-containing graphene.

The present application provides a heteroelement-containing graphene as a solution to the above problems. This heteroelement-containing graphene comprises carbon (C) and, as a heteroelement (X), at least one element selected from the group consisting of nitrogen (N), phosphorus (P), arsenic (As), sulfur (S), boron (B), and silicon (Si). Also, spots belonging to either the orthorhombic system or the hexagonal system and having the symmetry of a single crystal are observed in the selected area electron diffraction.

As described above, the conventional heteroelement-containing graphene has no long-range order in the crystal structure and no spots having the symmetry of a single crystal have been observed in selected area electron diffraction. On the contrary, when the heteroelement-containing graphene disclosed herein is subjected to the selected area electron diffraction, spots having the symmetry of a single crystal belonging to either the orthorhombic system or the hexagonal system are observed, for example. Thereby, highly crystalline heteroelement-containing graphene is provided.

In a preferred aspect of the heteroelement-containing graphene disclosed herein, the spots include an array of reciprocal lattice points 11-1, −111, −202, 1-1-1, 20-2, and −1-11 in an electron diffraction image belonging to the orthorhombic system with an incident direction of [101]. The heteroelement-containing graphene having the above configuration is preferable because the heteroelement-containing graphene can stably maintain high crystallinity by having a crystal structure of the orthorhombic system slightly deformed from a graphene structure of the hexagonal system.

The high crystallinity of the heteroelement-containing graphene disclosed herein can be confirmed by various indices. From another viewpoint, in a preferred aspect, the heteroelement-containing graphene disclosed herein includes carbon (C) and the at least one heteroelement (X), and the half width of the diffraction peak from the (002) planes in X-ray diffraction (XRD) is 3 degrees or less.

In the present description, "half width" means full width at half maximum (FWHM). The half width can be measured according to JIS R7651:2007, JIS K0131:1996, or the like. More specifically, for example, as illustrated in FIG. 5, the half width may be obtained by creating a baseline for a predetermined peak of the spectrum and measuring the width of the peak at (½*h), which is a height of ½ of the height (h) from the baseline of the peak.

In a preferred aspect of the heteroelement-containing graphene disclosed herein, a ratio (I(002)/I(101)) of a diffraction peak intensity I(002) from the (002) planes to a diffraction peak intensity I(101) from the (101) planes in X-ray diffraction (XRD) is 0.1 or more.

The high crystallinity of the heteroelement-containing graphene may also be specified by the XRD characteristics as described above. For example, the conventional heteroelement-containing graphene has a broad halo pattern by XRD. On the contrary, in the heteroelement-containing graphene disclosed herein, a peak indicating crystallinity is clearly observed in XRD. This makes it possible to clearly distinguish the heteroelement-containing graphene provided by the technique disclosed herein from the low crystallinity heteroelement-containing graphene that has been frequently observed.

In a preferred aspect of the heteroelement-containing graphene disclosed herein, the interplanar spacing between the (002) planes calculated by the X-ray diffraction analysis is 3.5 Å or less. Such a configuration provides heteroelement-containing graphene with better crystallinity.

In a preferred aspect of the heteroelement-containing graphene disclosed herein, an atomic ratio (X/C) of the at least one heteroelement (X) to carbon (C), calculated based on X-ray photoelectron spectroscopy (XPS), is 0.1 or more. In other words, there is provided a heteroelement-containing graphene having high crystallinity which contains a heteroelement at a high ratio of 10 atomic % or more. Such a material is provided for the first time by the present invention.

In a preferred aspect of the heteroelement-containing graphene disclosed herein, there is provided a heteroelement-containing graphene in which from the nitrogen N1s spectrum of XPS, the chemical bonding state of nitrogen doped to the basal plane is indicated to be that of cationic nitrogen, and from the Hall effect measurement, it can be determined that its carrier type is p-type.

The high crystallinity of the heteroelement-containing graphene disclosed herein can also be confirmed by other indices. In a preferred aspect of the heteroelement-containing graphene disclosed herein, the heteroelement-containing graphene includes carbon (C) and the at least one heteroelement (X), and in Raman spectroscopic analysis with an excitation wavelength of 532 nm, a ratio (I(D)/I(G)) of an intensity I(D) of a D band seen in the vicinity of 1350 $cm^{-1}$ to an intensity I(G) of a G band appearing in the vicinity of 1580 $cm^{-1}$ is 1 or less and the half width of the G band is 50 $cm^{-1}$ or less.

The high crystallinity of the heteroelement-containing graphene can also be specified by the Raman characteristics as described above. For example, the peak of the D band in the Raman spectrum of the conventional heteroelement-containing graphene is rounded in the first place, and does not appear as a steep peak (in other words, a peak that is not broad). On the contrary, the peak indicating the G band of the Raman spectrum of the heteroelement-containing graphene disclosed herein has a small half width, for example. Moreover, the peak of the G band can be higher in peak intensity than the peak indicating the D band. This also confirms the high crystallinity of the heteroelement-containing graphene disclosed herein.

In a preferred aspect of the heteroelement-containing graphene disclosed herein, a ratio (I(2D)/I(G)) of an intensity I(2D) of a 2D band seen in the vicinity of 2700 $cm^{-1}$ to the intensity I(G) of the G band is 0.5 or more in the Raman spectrum. Although the 2D band is a spectrum derived from defects in the crystal structure, the 2D band does not appear in the Raman spectrum of amorphous or poorly crystalline heteroelement-containing graphene. There can also be provided a heteroelement-containing graphene having high crystallinity that has not been seen by this.

In a preferred aspect of the heteroelement-containing graphene disclosed herein, the half width of the 2D band seen in the vicinity of 2700 $cm^{-1}$ is 80 $cm^{-1}$ or less in the Raman spectrum. The peak appearing in the Raman spectrum can be considered to be sharp based on the small half width. Therefore, a heteroelement-containing graphene with higher crystallinity can also be provided by the above configuration.

In a preferred aspect of the heteroelement-containing graphene disclosed herein, a base material that supports the heteroelement-containing graphene is not included. That is, the heteroelement-containing graphene disclosed herein can maintain its crystal structure flat, even when a heteroelement is introduced into graphene in the absence of a flat support base material. Thereby, the degradation of the function by the base material, the reduction of efficiency or the like can be suppressed when using the heteroelement-containing graphene as various functional materials, for example. As a result, for example, when the heteroelement-containing graphene is used as a catalyst or the like, the specific surface area is increased and the effects such as catalytic activity per unit weight are increased, which is preferable.

In a preferred aspect of the heteroelement-containing graphene disclosed herein, the heteroelement-containing graphene disclosed herein comprises a graphene sheet configured such that atoms of the carbon (C) are chemically bonded to atoms of the heteroelement (X) and atoms of the carbon (C) are principally $sp^2$-bonded to each other, and the graphene sheet has a single-layer structure formed by one layer or a stacked structure of two or more and five or less layers. Thereby, a heteroelement-containing graphene having excellent electrical, mechanical, and thermal properties resulting from the unique two-dimensional structure of the homographene sheet is provided, which is preferable.

In a preferred aspect, the heteroelement-containing graphene disclosed herein is a powder having an average particle size of 1 nm or more and 10 µm or less. In the case of such a powder having an average particle size of 1 nm or more and 10 µm or less, a heteroelement-containing graphene in a form that can be easily prepared and used for, for example, powder materials or pastes for various applications is provided, which is preferable.

In still another aspect, a technique to be disclosed herein provides a method for producing a heteroelement-containing graphene. This producing method includes the following steps:
(1) dissolving a hetero 5-membered ring compound having, at least partially, a 5-membered ring structure in a polar aprotic solvent to prepare a raw material-containing liquid, wherein the 5-membered ring is formed by the at least one heteroelement (X) and carbon (C); and (2) generating plasma in the raw material-containing liquid to polymerize the hetero 5-membered ring compound, thereby obtaining the heteroelement-containing graphene.

This method allows to simply and suitably obtain a highly crystalline heteroelement-containing graphene comprising carbon (C) and, as a heteroelement, at least one element selected from the group consisting of nitrogen (N), phosphorus (P), arsenic (As), sulfur (S), boron (B), and silicon (Si), wherein spots belonging to either the orthorhombic system or the hexagonal system and having the symmetry of a single crystal are observed in selected area electron diffraction.

The heteroelement-containing graphene of the present invention can maintain the flatness of the graphene sheet and has high crystallinity even with a large amount of nitrogen to be doped. Thus, the heteroelement-containing graphene of the present invention is expected to exhibit good semiconductor characteristics and catalytic characteristics. The method for producing a heteroelement-containing graphene of the present invention allows to efficiently produce the heteroelement-containing graphene.

BRIEF DESCRIPTION OF DRAWINGS

FIG. 1 is a schematic diagram showing a configuration of an in-liquid plasma generator.

FIG. 2 shows TEM images and selected area electron diffraction patterns of powders (a) to (d).

FIG. 3 is a graph illustrating X-ray diffraction patterns of the powders (a) to (d).

FIG. 4A is a graph illustrating XPS analysis results of the powders (a) to (d) by wide scanning.

FIG. 4B is a graph illustrating XPS analysis results of the powders (a) and (b) by narrow scanning.

FIG. 5 is a graph illustrating Raman spectra of the powders (a) to (d).

FIG. 6 is a view illustrating a result of a crystal structure analysis simulation of the powder (a).

FIGS. 7(a) to 7(c) are views describing a method for calculating a flatness ratio of a crystal structure of the powder (a).

FIG. 8 is a graph showing Hall effect measurement (semiconductor characteristics): the relationship between Hall mobility and temperature dependence.

FIG. 9 is a graph showing Hall effect measurement (semiconductor characteristics): the relationship between carrier concentration and temperature dependence.

FIG. 10 is a graph showing Hall effect measurement (semiconductor characteristics): the relationship between resistivity and temperature dependence.

FIG. 11 is a graph representing transparency of a thin film containing the nitrogen-containing graphene powder (a).

DETAILED DESCRIPTION OF THE EMBODIMENTS OF THE INVENTION

Hereinafter, the heteroelement-containing graphene of the present invention will be described. It should be noted that matters other than matters specifically mentioned in the present description (configuration of heteroelement-containing graphene) and matters necessary for the implementation of the present invention (for example, various analyses) are matters that can be implemented by those skilled in the art by grasping their contents based on the contents disclosed in the present description and drawings and the technical common sense in the field. In the present description, the notation "M to N" indicating the numerical range means M or more and N or less.

A heteroelement-containing graphene disclosed herein includes carbon (C) and, as a heteroelement, at least one element (X) selected from the group consisting of nitrogen (N), phosphorus (P), arsenic (As), sulfur (S), boron (B), and silicon (Si). As will be described later, the heteroelement-containing graphene generally has a graphene sheet as a main structure. The heteroelement is chemically bonded to carbon to form this graphene sheet. Based on this, the heteroelement-containing graphene disclosed herein is characterized as having crystallinity and particularly exhibiting high crystallinity that has not been seen. The heteroelement of graphene characterized as described above is preferably selected from the group consisting of nitrogen (N) and boron (B).

First, the configuration of the heteroelement-containing graphene will be described, and then the crystallinity will be described in detail.

The heteroelement-containing graphene of the present invention has a structure in which heteroelements are introduced in place of carbon atoms in a sheet-like graphene structure (carbon six-membered ring structure) composed mainly of carbon atoms, as exemplified by the following chemical structural formula 1, and does not have a structure in which heterographene is disposed at the edge. Here, in Formula 1, white circles indicate carbon and black circles indicate heteroelement. The carbon atoms are principally $sp^2$-bonded to form the graphene sheet. As shown in Formula 1, the position of the heteroelement is not an edge and is not strictly limited, but is disposed inside the planar structure of graphene. The position of the heteroelement may be changed depending on the raw material used for producing the heterographene and the production method. The position of the nitrogen atom affects the crystallinity, transparency, and flatness of the heterographene.

Considering the raw material, the production process, and that the product has high crystallinity, the heterographene of the present invention is considered to have a structure in which the heteroelement is not concentrated on the edges and is included in two opposing positions (para positions) of carbon six-membered rings. For example, when the heteroelement is nitrogen, the heterographene is as illustrated in the following chemical structural formula 2. In the heterographene of the present invention, it is preferable to introduce cationic nitrogen having the same number of valence electrons as carbon as 4. In the heterographene of the present invention, it is also preferable to introduce anionic boron. The reason why these heterographenes have a planar structure is considered to be because the same electron arrangement as the $sp^2$ structure is realized in the heteroatoms as in the carbon atoms constituting the graphene. Further, when the heteroatom is nitrogen, nitrogen with four valence electrons is involved in the nitrogen-carbon bond, so that nitrogen becomes a positive ion. As will be described later, the nitrogen-containing heterographene of the present invention becomes a semiconductor using the movement of holes, that is, a so-called P-type semiconductor.

[Chem. 1]

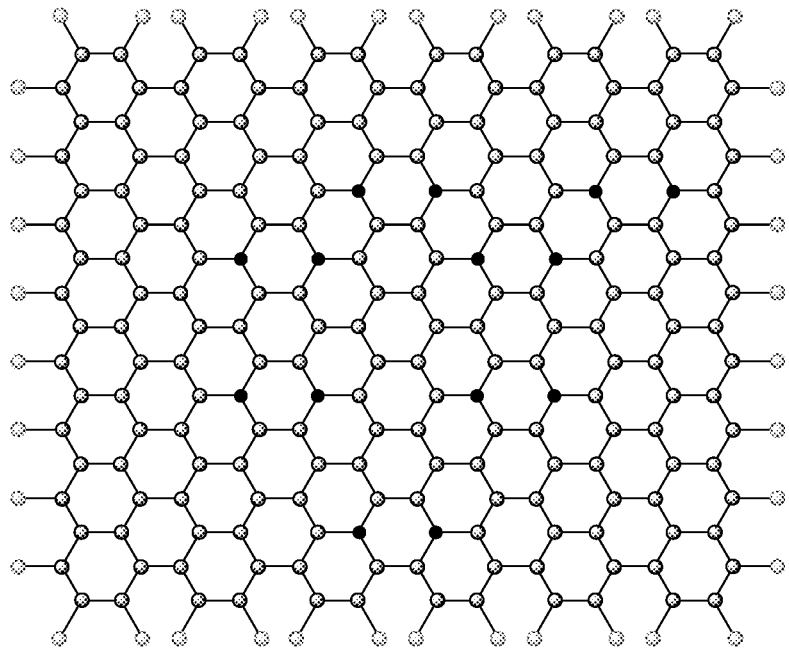

Formula 1

[Chem. 2]

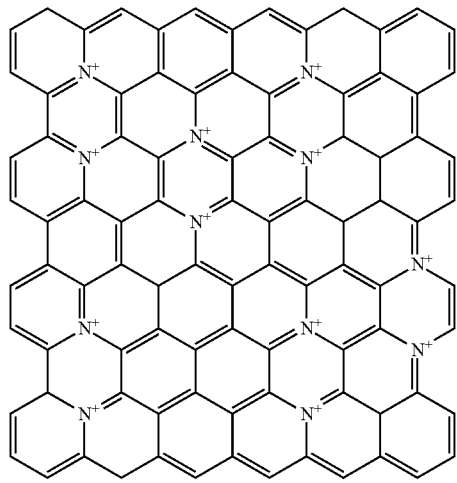

Formula 2

As can be understood from the above description, in the present description, the term "graphene sheet" is not limited to sheet-like graphene formed strictly only by carbon atoms, and includes graphene sheets in aspects in which the carbon atoms of the graphene sheets are replaced by the heteroelements. The "graphene sheet" referred to for the heteroelement-containing graphene (highly crystalline heteroelement-containing graphene) disclosed herein may be a graphene sheet in an aspect in which a heteroelement is included.

Further, the "heteroelement-containing graphene" in the present description may be composed of one graphene sheet, or may be composed of two, three, four, five, or more graphene sheets stacked. Further, graphene sheets having different numbers of layers may be mixed. From the viewpoint of obtaining highly crystalline heteroelement-containing graphene in which the properties resulting from the unique two-dimensional structure of the graphene sheet are more strongly reflected, the average number of layers of the graphene sheet is preferably about five or less, and may be four sheets or less, three sheets or less, two sheets or less, or one sheet. The heterographene of the present invention may be produced by a reaction using plasma described later. The number of layers stacked may be adjusted by changing the plasma conditions. That is, when the amount of energy per unit time is increased, the average total number of graphene sheets can be increased, and when the amount of energy per unit time is decreased, the average total number of graphene sheets can be reduced to, for example, an average of five or less.

When the number of conventional graphene sheets stacked is reduced to about several or less, the flatness of the graphene sheets is impaired. For example, it is known even homographene sheets composed of only carbon atoms are difficult to maintain the flatness of the sheets alone. Further, when a heteroelement is introduced even a little (for example, about several atomic %) instead of the carbon atoms in the graphene sheet, the flatness of the graphene sheet is further impaired. For example, good crystallinity has not been obtained even with heteroelement-containing graphene into which nitrogen is introduced at several atomic % or less. As a result, the conventional graphene sheets are curved or the crystal lattice is deformed, for example.

On the contrary, the heteroelement-containing graphene disclosed herein has a heteroelement introduced into the graphene sheet, while maintaining high crystallinity. Although the amount of heteroelement introduced is not strictly limited, the heteroelement may be introduced in an atomic ratio (X/C) of the heteroelement (X) to carbon (C) of, for example, 0.1 or more, that is, may be introduced in a ratio of 10 atomic % or more, preferably 12 atomic % or more, more preferably 13 atomic % or more, and further preferably 15 atomic % or more. In addition, the heteroelement-containing graphene of the present invention has higher crystallinity than conventional heteroelement-containing graphene, despite the large amount of the heteroelement introduced. It can be said that the heteroelement-containing graphene disclosed herein is a completely new material that has not been known. The upper limit of the amount of the heteroelement introduced is not particularly limited. Nitrogen atoms exist as ions in a state where the planar structure of graphene is maintained, and serve as hole-conducting carriers. Therefore, it is possible to increase the carrier density if a large amount of nitrogen atoms can be introduced. However, from the viewpoint of stably introducing heteroelements so that the essential physical and chemical properties of graphene are maintained and the planarity of the graphene sheet is not impaired, in a suitable example, the amount of the heteroelements introduced is approximately 30 atomic % or less. In the heteroelement-containing graphene, the amount of each heteroelement introduced relative to the carbon atom may be calculated based on, for example, the X-ray photoelectron spectroscopy (XPS). For example, it can be suitably calculated according to the method of an Example described later. The amount of nitrogen introduced may be adjusted by the nitrogen content ratio of the raw material molecules, the reaction temperature, the reaction time, and the discharge voltage. In order to increase the nitrogen content ratio, the amount of nitrogen introduced should be increased. However, increasing the reaction temperature, increasing the discharge voltage, or lengthening the reaction time likely leads to a decrease in the amount of nitrogen introduced.

Coronene is a kind of polycyclic aromatic hydrocarbon and has a structure in which six benzene rings are connected in a ring shape and is known to be a planar molecule. However, the chemical formula of coronene is $C_{24}H_{12}$, and it cannot be said that the crystal structure has long-range order. Therefore, when it is necessary to distinguish from a hydrocarbon such as coronene, the number of carbon atoms of the highly crystalline heteroelement-containing graphene disclosed herein can be defined as 30 or more, for example, appropriately 50 or more, preferably 100 or more, more preferably 500 or more, and particularly preferably 1000 or more. The number of carbon atoms of graphene may be adjusted by controlling the conditions at the time of production using plasma described later. When the amount of energy per unit time at the time of production is reduced, the number of constituent carbon atoms can be increased while maintaining the crystal structure having long-range order. Furthermore, it is preferable that graphene can be produced in a state where a homogeneous reaction phase is ensured.

In the present description, "highly crystalline" (high crystallinity) means that the crystal structure has long-range order. In the heterographene of the present invention, long-range order means being a two-dimensional crystal. The long-range order of the heterographene of the present invention is relatively high in the long-range order of the crystal structure as compared with a conventional material having the same composition. Whether or not any material has high crystallinity may be appropriately determined by using, for example, any one or more of the following analysis methods. Hereinafter, determination of the high crystallinity of the heteroelement-containing graphene by each method will be described.

(1) Evaluation by electron diffraction pattern
(2) Half width of diffraction peak of XRD pattern
(3) Half width of Raman spectrum (1) Electron Diffraction Pattern Crystallographic information of various materials may be obtained using electron diffraction. For example, whether the material is monocrystalline, polycrystalline, or amorphous can be determined by observing the electron diffraction pattern. Here, many materials are polycrystalline except for specific materials. Also, even if the material is close to a single crystal, when there is a precipitation phase, domain structure, or disorder in the crystal structure in the material, complex spot arrays or excessive spot arrays may appear in the electron diffraction pattern. However, even a polycrystalline material may be regarded as a collection of single crystal regions when viewed microscopically. The highly crystalline heteroelement-containing graphene disclosed herein is considered heteroelement-containing graphene in which spots having the symmetry of a single crystal belonging to either one of the orthorhombic system and the hexagonal system are observed in the selected area electron diffraction pattern.

The heteroelement-containing graphene may belong to the same hexagonal system as homographene formed only by carbon, or may belong to a crystal system in which the crystal lattice is deformed from the hexagonal system by introducing a heteroelement. One such crystal system is the orthorhombic system. As the amount of the heteroelement introduced increases, the amount of deformation of the unit lattice increases. Therefore, highly crystalline heteroelement-containing graphene typically belongs to the orthorhombic system. The present inventor believes that since such deformation of the unit lattice has long-range order, the flatness of the crystal of the highly crystalline heteroelement-containing graphene can be maintained well.

In the electron diffraction pattern of a single-crystal material, an array of diffraction spots according to the symmetry of a single crystal can be obtained. For example, taking the case where the heteroelement-containing graphene is the orthorhombic system as an example, when the incident direction is the [101] orientation, an electron diffraction pattern characteristic of the crystal structure is obtained. When the long-range order in the crystal structure of the heteroelement-containing graphene is high, the electron diffraction pattern thereof includes an array of electron diffraction spots corresponding to reciprocal lattice points 11-1, −111, −202, 1-1-1, 20-2, and −1-11. The electron diffraction pattern of polycrystalline material formed by overlapping electron diffraction patterns obtained from a plurality of single crystals. Accordingly, the electron diffraction pattern of a single-crystal material is obtained only as an electron diffraction pattern according to the symmetry of one kind of crystal.

In the case of an electron diffraction pattern using a transmission electron microscope, regularly arranged diffraction spots (spots) are obtained for a single crystal. The electron beam diffraction pattern of a single-crystal material may include, for example, clear spots without overlap. For polycrystals, concentric rings are obtained. When amorphous, a broad annular electron diffraction pattern is obtained. Whether or not the electron diffraction pattern shows the symmetry of a single crystal can be appropriately determined by those skilled in the art based on whether or not diffraction spots are obtained. For example, in the heteroelement-containing graphene of the present invention, the electron diffraction pattern preferably includes the spot array of the reciprocal lattice points in an electron diffraction pattern when the incident direction is the [101] orientation. Further, it is more preferable that the spot array of the reciprocal lattice points is included and no other spot array exhibiting crystal ordering is included.

The unit cell of the highly crystalline heteroelement-containing graphene of the present invention may have a form in which the unit cell of graphene is slightly deformed. The degree of deformation of the unit cell may be, for example, within a few percent (for example, within 3%). Such a unit cell of highly crystalline heteroelement-containing graphene may satisfy, for example, the following lattice conditions.

$a \neq b$
$a = 4.000$ to $4.300$ Å
$b = 2.300$ to $2.500$ Å
$c = 6.600$ to $7.200$ Å
$\alpha = \beta = \gamma = 90°$ (2) XRD Method Evaluation of crystallinity by the XRD method has been widely performed. It is known that the smaller the half width of the XRD peak attributed to the crystalline compound in the XRD pattern obtained by the powder XRD analysis, the higher the crystallinity of the compound in general. Therefore, this half width is preferably small from the viewpoint of high crystallinity. In the XRD pattern obtained by the XRD method, the half width of the XRD peak attributed to the compound of the highly crystalline heteroelement-containing graphene disclosed herein is generally smaller than the half width of the XRD peak obtained for the heteroelement-containing graphene containing nitrogen, sulfur, oxygen, boron, or the like that has been known. In the XRD pattern obtained by powder XRD analysis of the highly crystalline heteroelement-containing graphene of the present invention, the half width of the XRD peak from the (002) planes attributed to the carbon six-membered ring structure is preferably 3 degrees)(° or less, more preferably 2.8 degrees or less, further preferably 2.6 degrees or less, or may be, for example, 2.5 degrees or less.

The XRD peak for a typical crystalline compound can be sufficiently small such that the half width is 1 degree or less, or is, for example, 0.5 degree or less. Examples of crystalline carbon materials include graphite with improved crystallinity and diamond. However, there are many carbon materials with low crystallinity called formless carbon, amorphous carbon, or the like. Regarding the heteroelement-containing graphene of the present invention, determination can be made that relatively high and sufficient crystallinity is exhibited when the half width of the XRD peak from the (002) planes is 3 degrees or less.

Here, when the XRD peak from the (002) planes is extremely small, the half width of 3 degrees or less can be easily satisfied. The lower the crystallinity of the heteroelement-containing graphene, the smaller the XRD peak from the (002) planes. Therefore, when determining that the heteroelement-containing graphene is highly crystalline in the present invention, it is preferable that a ratio (I(101)/I(002)) of a diffraction peak intensity I(101) from the (101) planes to a diffraction peak intensity I(002) from the (002) planes be 0.1 or more. With high XRD peak intensity from the (002) planes, the peak intensity ratio (I(101)/I(002)) of 0.1 or more is easily achieved. As such, determination can be made that the crystallinity of heteroelement-containing graphene is high when the XRD peak intensity from the (002) planes is high and the half width is low.

Since there is a small number of graphene sheets in the highly crystalline heteroelement-containing graphene of the present invention, the stacking regularity in the crystal structure is low. Therefore, there is a possibility that no peak corresponding to the hkl diffraction line seen in the XRD pattern of natural graphite in the strict sense is observed, and only the 001 diffraction line and the hk diffraction line is observed. In such a case, in the present description, the expression "(101) plane" may be read as "(10) plane".

(3) Raman Spectrum

The single-layer graphene sheet (monographene) has a Raman activity in the double-degenerate Eg mode as in the case of graphite, and in the Raman spectrum, first, a first-order Eg band, that is, a G band is observed in the vicinity of 1580 $cm^{-1}$. When the G band in the Raman spectrum is observed, it can be confirmed that highly crystalline heteroelement-containing graphene includes a graphene sheet made of $sp^2$ carbon. In addition to this, it is known that the Raman spectrum of the graphene sheet has some characteristic peaks. For example, when a disorder or defect occurs in the graphite structure, in addition to the D band, an originally inactive band appears as peaks called the D band and the D' band in the vicinity of 1350 $cm^{-1}$ and 1620 $cm^{-1}$, respectively. In the case of the heteroelement-containing graphene, when a heteroelement is introduced into the graphene structure, the graphite structure may be disordered. As a result, there are cases that the D band, the D' band, or the like appear in the Raman spectrum of the heteroelement-containing graphene, and these peaks including the G band may be broadened.

Here, with respect to the highly crystalline heteroelement-containing graphene disclosed herein, it is observed that the half width of the G band is small from the viewpoint of high crystallinity. In the Raman spectrum obtained by Raman spectroscopic analysis, the half width of the G band of the highly crystalline heteroelement-containing graphene of the present invention is generally smaller than that of the G band of a Raman shift obtained for the conventionally known heteroelement-containing graphene. For example, in the Raman spectrum obtained for highly crystalline heteroelement-containing graphene in which the excitation wavelength is 532 nm, the half width of the peak attributed to the G band may be 50 $cm^{-1}$ or less (for example, less than 50 $cm^{-1}$). The half width of the peak attributed to the G band is more preferably 45 $cm^{-1}$ or less, further preferably 40 $cm^{-1}$ or less, and may be, for example, 35 $cm^{-1}$ or less.

There are cases where a peak derived from the 2D band, which is said to be related to the number of layers of the graphene sheets, is observed in the vicinity of 2700 $cm^{-1}$ (2nd harmonic of D band) in the Raman spectrum of the highly crystalline heteroelement-containing graphene of the present invention. In general, it is said that the peak of the 2D band is sharp for monographene, but broadens as the number of layers of graphene sheets increases and the 2D band peak of the graphene sheet of five or more layers almost matches that in the spectrum of bulk HOPG. Further, it is said that although the 2D band of monographene exhibits higher intensity than the G band, the intensity of the G band with respect to the 2D band increases as the number of layers increases up to about five layers. However, the 2D band is unlikely to appear in the Raman spectrum of amorphous or poorly crystalline heteroelement-containing graphene. In the Raman spectrum of the highly crystalline heteroelement-containing graphene of the present invention, a ratio I(2D)/I(G)) of an intensity I(2D) of the 2D band seen in the vicinity of 2700 $cm^{-1}$ to the intensity I(G) of the G band is usually 0.5 or more, and the ratio (I(2D)/I(G)) is more preferably 0.6 or more, further preferably 0.7 or more, and particularly preferably 0.8 or more. Meanwhile, reducing the number of layers of graphene sheets in the highly crystalline heteroelement-containing graphene relatively small is possible. In that case, although there is no particular limitation on the upper limit of I(2D)/I(G), the ratio (I(2D)/I(G)) may be set to approximately 5 or less, for example, 1 or less (for example, less than 1).

Further, the highly crystalline heteroelement-containing graphene of the present invention preferably has a narrow half width of the 2D band of the Raman spectrum. The half width of the peak attributed to the 2D band is usually 80 $cm^{-1}$ or less (for example, less than 80 $cm^{-1}$), more preferably 75 $cm^{-1}$ or less, further preferably 70 $cm^{-1}$, and may be, for example, 65 $cm^{-1}$ or less.

Although the specific shape of the highly crystalline heteroelement-containing graphene of the present invention is not particularly limited, the heteroelement-containing graphene may be provided as a powder having an average particle size of 1 nm or more and 10 μm or less, for example. The average particle size of the highly crystalline heteroelement-containing graphene may be 5 nm or more, may be 10 nm or more, and may be 100 nm or more. The average particle size of the highly crystalline heteroelement-containing graphene may be 5 μm or less, may be 3 μm or less, and may be 1 μm or less. From the viewpoint that the hetero-containing graphene of the present invention is a two-dimensional crystal, it is preferable that the average particle size be large. The average particle size may be adjusted by controlling the conditions at the time of production using plasma described later. The particle size does not increase when the reaction temperature is low. From the viewpoint of the particle size, the smaller the energy of the plasma per unit time, the better.

Further, the highly crystalline heteroelement-containing graphene does not include a base material that supports itself. Thereby, there is provided a material that is lightweight and excellent in functionality per unit weight (for example, semiconductor characteristics, catalytic activity, etc.).

[Method for Producing Highly Crystalline Heteroelement-Containing Graphene]

The highly crystalline heteroelement-containing graphene may be suitably produced by the following steps.

<1> A hetero 5-membered ring compound having, at least partially, a 5-membered ring structure in which the 5-membered ring is formed by a heteroelement (X) and carbon (C) is prepared as a raw material compound. Here, the heteroelement is at least one selected from the group consisting of nitrogen (N), phosphorus (P), arsenic (As), sulfur (S), and boron (B).

<2> Next, the prepared raw material compound is dissolved in a polar aprotic solvent to prepare a raw material-containing liquid.

<3> Then, by generating plasma in the raw material-containing liquid, the hetero 5-membered ring compound is opened and polymerized.

Here, as will be shown in Examples described later, a combination of a raw material compound and a polar aprotic solvent is suitably used for obtaining the highly crystalline heteroelement-containing graphene of the present invention. When the combination is not suitable, poorly crystalline heteroelement-containing graphene is synthesized as in the prior art. Moreover, when deviated from a suitable combination, the incorporation of the heteroelement into the graphene is relatively suppressed, and heteroelement-containing graphene that does not have high crystallinity (for example, amorphous) is obtained.

The hetero 5-membered ring compound as a raw material compound is preferably, for example, a heteroaromatic compound containing a heteroelement at positions 1 and 3 of the 5-membered ring, although it cannot be unconditionally determined because it also depends on the kind of the heteroelement. The heteroelement at the 1-position may be the same as or different from that at the 3-position. The heteroelements are preferably the same element. The hetero 5-membered ring compound is preferably a compound containing nitrogen as a heteroelement. The hetero 5-membered ring compound is preferably, for example, an amine containing nitrogen at the 1-, 3-positions of the 5-membered ring, and for example, an imidazole compound may be preferably used. The hetero 5-membered ring compound is also preferably an ionic compound. As such an ionic compound, for example, a salt that dissolves in water and has, as the anion, an ion containing the same heteroelement as that contained in the hetero 5-membered ring compound and carbon is preferable. Examples of such ionic compounds include cyanate, thiocyanate, and cyanamide. Suitable examples of the hetero 5-membered ring compound include imidazolium salts such as 1-ethyl-3-methylimidazolium dicyanamide and 1-butyl-3-methylimidazolium thiocyanate.

As the polar aprotic solvent, a solvent that easily dissolves the raw material compound and does not have proton donor ability may be preferably used. Examples of such polar aprotic solvents include dimethylsulfoxide and dimethylformamide. The raw material-containing liquid may be prepared by dissolving the hetero 5-membered ring compound in a polar aprotic solvent.

Next, an in-liquid plasma is generated in the raw material-containing liquid as a reaction field for polymerization and carbonization of the raw material compound. As will be described later in Examples, a non-equilibrium solution plasma 4 is formed between electrodes 6 by applying a pulse voltage between the electrodes 6 in a liquid 2 by an in-liquid plasma generator 10 of FIG. 1. The solution plasma (plasma phase) 4 is formed in a gas phase formed between the electrodes 6. Such a plasma reaction field is constantly maintained between the electrodes 6. In the plasma reaction field, active species such as electrons having high energy, ions, and radicals are supplied from the plasma phase to the liquid phase. Meanwhile, the raw material compound contained in the liquid phase is supplied from the liquid phase to the gas phase and the plasma phase. Then, these contact (collide) mainly at the interface between the liquid phase and the gas phase. Thereby, the raw material compound is polymerized and carbonized to produce highly crystalline heteroelement-containing graphene.

Since the generated plasma interacts with the wall of the container, it is necessary to keep the distance from the wall appropriate from the viewpoint of plasma stability. Further, the yield of hetero-containing graphene increases as the electrode 6 moves away from the liquid surface. Therefore, in order to increase the yield according to the size of the reaction apparatus used, the raw materials, the solvent, or the like, it is necessary to adjust their arrangement. By adjusting the arrangement of the electrodes 6 or the like as such, the yield of the heterographene of the present invention can be set to 1 to 30%, preferably 10 to 30%, and more preferably 20 to 30%.

Conditions for generating in-liquid plasma may be set to, for example, a voltage (secondary voltage): about 1 kV to 2 kV, a frequency: about 10 kHz to 30 kHz, and a pulse width: about 0.5 μs to 3 μs. Further, in order to enable stable generation of solution plasma, the electric conductivity of the raw material-containing liquid is preferably in the range of about 300 μS·$cm^{-1}$ to 3000 μS·$cm^{-1}$. Since the disclosure of Patent Japanese Patent Laid-Open No. 2012-153555 can be referred to for more detailed conditions for generating in-liquid plasma, their repeated description will be omitted.

As described above, the highly crystalline heteroelement-containing graphene and the production method thereof have been described based on the preferred embodiment, but the present invention is not limited to these examples, and can be performed by appropriately changing the aspect. For example, the liquid containing the raw material compound may contain a compound other than the raw material compound as long as the object of the present invention is not impaired. In generating solution plasma, it is not always necessary to use a needle-like electrode made of tungsten, and an electrode having any shape formed by other conductive materials may be used. Further, the solution plasma may also be generated with an induction coil having a low inductance without using an electrode. The in-liquid plasma is not limited to solution plasma (glow discharge plasma), and may be implemented using, for example, arc discharge plasma in the liquid.

The highly crystalline heteroelement-containing graphene provided by the present invention has improved crystallinity. This can improve various characteristics of the highly crystalline heteroelement-containing graphene including electrical conductivity and catalytic activity. As a result, it is allowed to separately produce, for example, highly crystalline heteroelement-containing graphene exhibiting electronic conductivity and highly crystalline heteroelement-containing graphene having n-type or p-type semiconductor characteristics. Thereby, a lightweight and flexible semiconductor chip can be developed, for example. In addition, various semiconductor chips can be developed, which can help to realize flexible semiconductor devices.

Non-Limiting Examples

Next, although Examples related to the present invention are shown, it is not intended that the present invention is limited by those shown in such Examples.

[Production of Heteroelement-Containing Graphene]

As a raw material compound, 1-ethyl-3-methylimidazolium dicyanade (EMIM-DCA, C8H11N5, CAS registration number: 370865-89-7), which is a nitrogen-containing 5-membered ring organic molecule, was prepared. The following four organic solvents (a) to (d) were prepared as the solvents. Then, the raw material compound and the solvents were mixed at a mass ratio of 1:9, and the raw material compound was dissolved to prepare the raw material compound-containing liquids (a) to (d).

Organic Solvents
  (a) N,N-dimethylformamide (DMF, $(CH_3)_2NCHO$)
  (b) Acetonitrile ($CH_3CN$)
  (c) benzene ($C_6H_6$)
  (d) Toluene ($C_6H_5CH_3$)

Next, the solution plasma 4 was generated in each raw material compound-containing liquid using the in-liquid plasma generator 10 shown in FIG. 1. The in-liquid plasma generator 10 includes a container 5 including a glass beaker for accommodating the raw material compound-containing liquid 2, a pair of plasma generating electrodes 6 fixed to the container 5, and a power supply 8 for applying a voltage to the electrode 6. The electrode 6 is formed by a tungsten wire having a diameter of 1.0 mm (manufactured by The Nilaco Corporation), and the distance between the electrodes is set to 0.3 mm. The wire had an exposed tip portion, and the other portions were covered with an insulating member 9 made of fluororesin. As the power supply 8, a bipolar DC power supply was used.

The raw material compound-containing liquid 2 selected from the raw material compound-containing liquids (a) to (d) prepared above was put into the container 5 and stirred by a stirring device 7 including a magnetic stirrer. The amount of the raw material compound-containing liquid 2 was adjusted so that the counter electrode 6 portion was immersed in the middle of the raw material compound-containing liquid 2. Thereafter, a predetermined pulse voltage was applied between the electrodes 6 (electrodes 0.1 mm) from the external power supply 8 (bipolar pulse DC power supply) to generate plasma between the electrodes 6 in the liquid. The pulse voltage conditions were: inter-terminal voltage: +1500V→0V→1500V→0V→+1500V, repetition frequency: 200 kHz, and pulse width: 1 μs, and plasma was generated in the raw material compound-containing liquid 2 for 5 minutes.

All of the raw material compound-containing liquids (a) to (d) were colorless and transparent, but turned to be yellowish immediately after the generation of plasma, and changed to a brown or black opaque liquid after about 5 minutes. This discoloration is considered to be because the raw material compound was polymerized to form a graphite skeleton. Then, the raw material compound-containing liquid after the plasma treatment was dried to obtain a black powder. Hereinafter, the nitrogen-containing graphene powders (a) to (d) respectively obtained from the raw material compound-containing liquids (a) to (d) were subjected to the following analyses, and their crystal structures and the like were examined.

[Selected Area Electron Diffraction Analysis]

The nitrogen-containing graphene powders (a) to (d) were subjected to selected area electron diffraction analysis to examine the crystal structure of each powder. Electron diffraction patterns were obtained and TEM observations were performed using the high-resolution transmission electron microscope (TEM) JEM-2500SE manufactured by JEOL Ltd. as the analyzer. The conditions for obtaining the selected area diffraction image were an electron beam acceleration voltage of 200 kV, a field area of about 350 nm, and a camera length of 300 cm. In this apparatus, the diffraction pattern is captured as a digital signal by a slow scan CCD camera and displayed on a liquid crystal display. The resolution of the CCD chip is 3413 pixels/m×3413 pixels/m, and the frame size of the camera is 640 pixels×536 pixels. When observing, one particle in the powder was selected by the TEM function, first, and the crystal orientation was adjusted by controlling the tilt of the X axis and the Y axis of the sample while observing the electron diffraction pattern, and the TEM image was acquired at the position where the clearest electron diffraction pattern was obtained. The above results are shown in FIG. 2.

[X-Ray Diffraction Analysis]

The nitrogen-containing graphene powders (a) to (d) were subjected to powder X-ray diffraction to examine the crystal structure of each powder. The analysis was carried out under the following analysis conditions using SmartLab (9 kW) manufactured by Rigaku Corporation as the X-ray diffraction analyzer. The X-ray patterns are shown in FIG. 3.

X-ray source: Cu-Kα ray
  X-ray generation current: 200 mA
  X-ray generation voltage: 45 kV
  Slit angle: 0.5°
  Slit width: 1.0 mm
  2θ=10 to 80°

Step interval: 0.02°
Step measurement time: 3s

[X-Ray Photoelectron Spectroscopy Analysis]

The nitrogen-containing graphene powders (a) to (d) were subjected to X-ray photoelectron spectroscopy (XPS) analysis, and the elements constituting each powder were identified and their chemical states were examined. Specifically, a sample was scanned in the entire energy range (0 to 1100 eV), and a wide scan analysis for qualitative analysis with high sensitivity was performed, and then a narrow scan analysis for scanning a narrow energy range of 394 to 406 eV was performed to thereby examine the bonding state of nitrogen atoms in the powder. Analysis was performed under the following analysis conditions using VersaProbe II manufactured by ULVAC-PHI, Inc. as the XPS analyzer.

X-ray source: Mg-Kα ray
X-ray generation current: 1.7 mA
X-ray generation voltage: 25 kV

[Raman Spectroscopic Analysis]

The nitrogen-containing graphene powders (a) to (d) were subjected to Raman spectroscopic analysis, and the types and states of the substances constituting the powders were examined. The analysis was carried out under the following analysis conditions using NRS-100 manufactured by JASCO Corporation as Raman spectroscopic analyzer.

Excitation wavelength: 532 nm
Output: 2 mW
Exposure time: 10 seconds
Average frequency: 5

[Evaluation]
[Selected Area Electron Diffraction Analysis]

FIGS. 2(a) to 2(d) show TEM images of the nitrogen-containing graphene powders (a) to (d) and the electron diffraction patterns obtained by selected area electron diffraction analysis. Each TEM image is at an appropriately selected magnification.

The nitrogen-containing graphene powders (a) to (d) are samples obtained from the same raw material compound EMIM-DCA, but differ in the type of solvent in which the raw material compound is dissolved. As shown in FIG. 2(a), it was confirmed that in the electron diffraction pattern of the nitrogen-containing graphene powder (a) obtained by using DMF as a solvent, spots showing the symmetry of a single crystal in which the regular hexagon is slightly distorted were obtained. From this, it was found that the nitrogen-containing graphene powder (a) was formed by a single crystal. Further, as shown in FIG. 2(b), it was confirmed that the electron diffraction pattern of the powder (b) obtained using acetonitrile as the solvent formed concentric Debye rings and crystals were present at various angles in the measurement region. That is, it was found that the powder (b) contained polycrystal. On the other hand, as shown in FIGS. 2(c) and 2(d), the electron diffraction patterns of the powder (c) obtained using benzene as the solvent and the powder (d) obtained using toluene all formed concentric halo patterns and no clear diffraction spots were observed. From this, it was found that the powders (c) and (d) were amorphous without crystal structure. Further, in the production of the heteroelement-containing carbonaceous material using solution plasma, the crystallinity of the compound to be generated varies depending on the type of organic solvent in which the raw material compound is dissolved.

[XRD Analysis]

FIG. 3 shows X-ray diffraction patterns of the obtained nitrogen-containing graphene powders (a) to (d). Regarding the nitrogen-containing graphene powder (a), it was confirmed that a diffraction peak from the (002) planes was observed in the vicinity of 2θ=26°, and a diffraction peak from the (10) plane was observed in the vicinity of 2θ=42 to 50°. However, the powders (b) to (d) showed only a slight broad peak, indicating that the powders (b) to (d) had no crystal structure, or if had, amorphous with almost no long-range order. This result is supported by the results of electron diffraction analysis.

[XPS Analysis]

Next, FIG. 4A shows the results of wide scan analysis of the obtained nitrogen-containing graphene powders (a) to (d) by XPS analysis. As shown in FIG. 4A, in all the XPS spectra of the nitrogen-containing graphene powders (a) to (d), it was confirmed that a C1s peak was observed at a binding energy in the vicinity of 285 eV, an N1s peak in the vicinity of 398 eV, and an O1s peak in the vicinity of 531 eV. It was confirmed that all the nitrogen-containing graphene powders (a) to (d) were materials containing carbon (C), nitrogen (N), and oxygen (O). However, although the C1s peaks of the nitrogen-containing graphene powders (a) to (d) were sharp and large, the N1s peaks and the O1s peaks became smaller in the order of the nitrogen-containing graphene powders (a) to (d). Table 1 below shows the ratio of each element when the total amount of carbon (C), nitrogen (N), and oxygen (O) in each powder was 100 atomic %.

TABLE 1

| Powder | Powder C1s [atmic %] | O1s [atmic %] | N1s [atmic %] |
|---|---|---|---|
| (a) | 81.4 | 5.2 | 13.4 |
| (b) | 80.1 | 12.7 | 7.1 |
| (c) | 91.9 | 6.1 | 2.0 |
| (d) | 91.7 | 6.6 | 1.8 |

As shown in Table 1, it was found that the oxygen content of the nitrogen-containing graphene powders (a), (c), and (d) was slightly lower at 5 to 7 atomic %, but the powder (b) obtained using acetonitrile as the solvent had a high oxygen content of more than 10 atomic %. Regarding the nitrogen content, the powders (c) and (d) were as small as 2 atomic % or less, whereas the nitrogen-containing graphene powders (a) and (b) were relatively high at 13.4 atomic % and 7.1 atomic %, respectively. From this, it was found that in the production of the heteroelement-containing carbonaceous material using solution plasma, the compositions of the compounds to be generated may differ depending on the type of organic solvent in which the raw material compound is dissolved. For example, regarding the nitrogen-containing graphene powder (a), it was found that the nitrogen content was as high as over 10 atomic % and the oxygen content was as low as less than 5.5%.

Next, FIG. 4B shows a result obtained by performing narrow scan analysis on the nitrogen-containing graphene powders (a) and (b) having a relatively high nitrogen content. In the region where the binding energy is 395 to 405 eV, nitrogen atom spectrum indicating various bonding states can be observed by scanning with high resolution. Therefore, the narrow scan spectrum of the N1s peak based on the XPS analysis is shown as being separated into peaks indicating four types of bonding states of nitrogen atoms. That is, the N1s peak was separated into (1) a pyridine-type binding peak in the vicinity of 398.5 eV, (2) a pyrrole-type (N5) peak in the vicinity of 400.5±0.2 eV, (3) a cationic (N+) peak in the vicinity of 401.2±0.2 eV, and (4) a pyridone-type (NOX) peak in the vicinity of 402.9±0.2 eV. It was confirmed that the nitrogen-containing graphene powders (a) and (b) contained nitrogen atoms in all the four bonding states. Although not specifically shown, as can be seen from FIG. 4B, the nitrogen-containing graphene powders (a) and (b) contain a relatively large amount of pyridine-type nitrogen and cationic nitrogen. However, since pyridine-type nitrogen can be introduced only to the edge, the predominant nitrogen introduced in the plane is cationic nitrogen. It can be said that including a large amount of cationic nitrogen indicates that nitrogen atoms are introduced inside the graphene sheet instead of the edges thereof.

[Raman Spectroscopic Analysis]

FIG. 5 shows Raman spectra of the obtained nitrogen-containing graphene powders (a) to (d). For all the nitrogen-containing graphene powders (a) to (d), it was confirmed that the G band, which is one of the characteristic peaks of graphene and derived from the graphite structure (carbon six-membered ring structure), appeared in the vicinity of 1580 cm$^{-1}$ and the D band resulting from structural disorder and defects in the vicinity of 1350 cm$^{-1}$. The G band and the D band of the nitrogen-containing graphene powder (a) form relatively steep peaks, and the Raman spectrum indicates the high crystallinity of the nitrogen-containing graphene powder (a). Within the present inventor's knowledge, it has not been reported that the G band appears as a sharp peak with respect to graphene into which a heteroelement has been introduced (in particular, free-standing graphene not formed on a base material). The half width (FWHM) of the G band of the nitrogen-containing graphene powder (a) was 34.0 cm$^{-1}$. However, it was found that the peak becomes broader as the crystallinity of the powdered nitrogen-containing graphene powders (b), (c), and (d) decreases. It can be roughly said that the powders (c) and (d) are amorphous, and this matches with the results of electron diffraction analysis and the like.

In the nitrogen-containing graphene powder (a), a secondary Raman scattering band (2D band) involving two phonons was clearly observed in the vicinity of 2700 cm$^{-1}$. The half width (FWHM) of the 2D band of the powder (a) was 68.2 cm$^{-1}$. This 2D band was slightly observed in the powder (b), but could not be observed for the nitrogen-containing graphene powders (c) and (d). The powder (a) has the D' band resulting from defects was observed in the vicinity of 1620 cm$^{-1}$, the D+D" coupling mode in the vicinity of 2446 cm$^{-1}$, and the D+D' coupling mode in the vicinity of 2950 cm$^{-1}$, and thus is expected to have a more complex crystal structure than graphene.

Table 2 below shows the intensity ratio (I(D)/I(G)) of the D band to the G band in each Raman spectrum of the nitrogen-containing graphene powders (a) to (d), and the intensity ratio (I(2D)/I(G)) of the 2D band to the G band in the Raman spectrum of the powder (a). Each I(D)/I(G) of the amorphous powders (c) and (d) was from 0.86 to 0.87. Each I(D)/I(G) of the powders (a) and (b) considered to have higher crystallinity than the powdered nitrogen-containing graphene powders (c) and (d) was 0.74 and 0.99. In general, I(D)/I(G) is also called an R value, and is an index used for evaluating the degree of graphitization of carbonaceous material. However, recent studies have shown that the R value is not versatile for all carbon materials because of its complex behavior depending on various factors. In this example, it was confirmed that for a sample in which the crystallinity is greatly low and clear D band and G band cannot be obtained, the I(D)/I(G) does not function as the index of crystallinity. On the other hand, in the powder (a) having relatively high crystallinity, the Raman spectrum clearly reflected the crystallinity and I(D)/I(G) was less than 1 (for example, 0.8 or less). In other words, it can be said that I(D)/I(G) can indicate a low number of defects present in the graphene structure and, consequently, the high degree of crystallinity.

TABLE 2

| Powder | I (D) /I (G) [—] | I (2D) /I (G) [—] |
|---|---|---|
| (a) | 0.74 | 0.82 |
| (b) | 0.99 | — |
| (c) | 0.87 | — |
| (d) | 0.86 | — |

[Crystal Structure Analysis]

From the above, it was found that heteroelement-containing graphene having excellent crystallinity can be obtained by using EMIM-DCA as a raw material compound and DMF as a solvent. Therefore, a more detailed crystal structure analysis was performed from the electron diffraction pattern and the XRD pattern of the nitrogen-containing graphene powder (a). FIG. 6 shows the result of the simulation of the crystal structure analysis. Spots indicated by arrows in the figure are actually obtained electron diffraction spots (see FIG. 2(a)). The spots (black circles) not indicated by arrows in the figure are diffraction spots theoretically obtained from the graphene (graphite) crystal structure. Table 3 below shows the lattice conditions of the unit cell used to create the diffraction spots of graphene (graphite) and the results of the crystal structure analysis based on the electron diffraction pattern of the nitrogen-containing graphene powder (a).

TABLE 3

| | Graphene (Graphite) | Powder (a) |
|---|---|---|
| Space group | P 63mc | Cmmm |
| Point group | $C_{6v}^4$ (hexagonal system) | $D_{2h}^{19}$ (orthorhombic system) |
| Two-dimensional lattice | 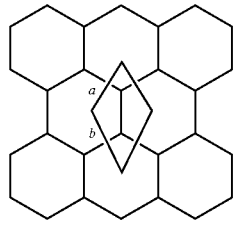 | 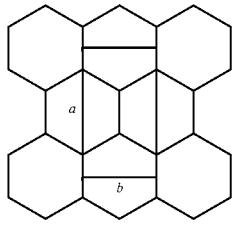 [SMILES: C1CC2CC3CCCC4C5CCCC6CC7CCCC8C(C1)C19C2C3C42C1C1C89C7C6C512] |
| Lattice conditions | a = b<br>a = 2.4700 Å<br>c = 6.7900 Å<br>α = β = 90.00°<br>γ = 120.00 | a ≠ b<br>a = 4.01602 Å<br>c =6.89 Å<br>c = 6.89 Å<br>α = β = γ = 90° |

As shown in FIG. 6, the electron diffraction pattern of the nitrogen-containing graphene powder (a) forms a spot that is roughly similar to the electron diffraction pattern of graphite, but its form is slightly flattened. As a result of the structure analysis, it was found that the electron diffraction pattern shown in FIG. 6 is a diffraction image from the [101] orientation, which is a feature of the orthorhombic system. From the amount of spot deviation, the unit cell in the crystal structure of the nitrogen-containing graphene powder (a) was deformed such that the ideal six-membered ring structure of graphene in the planar lattice collapsed in the a-axis direction in the orthorhombic system, as shown in Table 3. At the same time, the lattice constant of the a-axis of the unit cell determined according to the symmetry of the orthorhombic system was extended to about 4 Å. Due to the enlargement of the size of the planar lattice of the nitrogen-containing graphene powder (a), the interplanar spacing d002 between the (002) planes became 3.428 Å and the interplanar spacing d101 between the (101) planes became 2.097 Å. This is consistent with the fact that the half width of the diffraction peak from the (002) planes of 2.59° in the vicinity of 26° in the XRD diffraction pattern shown in FIG. 3 is larger than the half width that would have been obtained for the diffraction peak from the (002) planes of graphene.

Thus, the flatness ratio of the unit cell in the crystal structure of the nitrogen-containing graphene powder (a) was calculated. FIGS. 7(a) to 7(c) show electron diffraction patterns for explaining the method of calculating the flatness ratio of a unit cell. FIG. 7(a) is a view in which reciprocal lattice points are marked on diffraction spots obtained by electron beam diffraction analysis. FIG. 7(b) is a view in which reciprocal lattice vectors A to D extending from the origin of the unit cell are overlapped on the diffraction spots (reciprocal lattice points) of FIG. 7(a). FIG. 7(c) is a view in which the reciprocal lattice vectors A to D are overlapped on the theoretically obtained electron diffraction pattern of graphene shown in FIG. 6. This FIG. 7(c) corresponds to the reciprocal lattice vectors of graphene before a heteroelement is introduced. The reciprocal lattice vectors A to D in FIGS. 7(b) and 7(c) are vectors connecting the origin and reciprocal lattice points (−111), (020), (11-1), and (20-2), respectively. Table 4 below shows the lengths of the reciprocal lattice vectors A, C, and D of the nitrogen-containing graphene powder (a) and the graphene as relative lengths with respect to the lengths of the respective reciprocal lattice vectors. Further, the degree of deformation of the reciprocal lattice vector in the nitrogen-containing graphene powder (a) with respect to the graphene before the introduction of the heteroelement was calculated as the flatness ratio in the direction of the vector by the following equation.

Flatness ratio=(length of reciprocal lattice vector of nitrogen-containing graphene powder (a))/ (simulated length of reciprocal lattice vector of graphite)×100

TABLE 4

| Relative length | | | Reciprocal lattice vectors | | |
|---|---|---|---|---|---|
| | | | A | C | D |
| Reciprocal lattice vectors | Powder (a) | A | 1 | 0.9830 | 1.069 |
| | | C | 1.017 | 1 | 1.115 |
| | | D | 0.9122 | 0.8967 | 1 |
| | Graphene | A | 1 | 1 | 1.123 |
| | | C | 1 | 1 | 1.123 |
| | | D | 0.8904 | 0.8904 | 1 |
| Flatness ratio (%) | | (20-2) direction: | 102.4 | | |
| | | (11-1) direction: | 98.3 | | |

The flatness ratio of the unit cell of the nitrogen-containing graphene powder (a) was 102.4% in the (20-2) direction and was 98.3% in the (11-1) direction, and thereby confirmed to be obliquely deformed. However, the flatness ratio is within about 3% in all the directions, and thus it was found that the highly crystalline heteroelement-containing graphene disclosed herein can maintain the high crystallinity well, even if the heteroelement is introduced in a large amount, with only a slight change in the crystal structure of the graphene.

[Hall Effect]

The semiconductor characteristics of the nitrogen-containing graphene powder (a) were measured. As a measuring device, Toyo Corporation 8400ACLR/OW type was used.

A powder sample was placed in a mold of a predetermined size, and a molded product obtained by pressing at 50 MPa was used as a measurement sample. Thereafter, the film thickness of the measurement sample was measured using a micrometer.

The measurement sample was pretreated at 280° C. in an argon atmosphere.

The measurement conditions are as follows.

Measurement Conditions (Room Temperature Measurement)

H3
Size: 4 mm×4 mm×118 μm
Temperature: 290.2K
Current: 7 mA
Magnetic field: 0.3744T (AC 250 mHz)

H4
Size: 5 mm×5 mm×117 μm
Temperature: 290.5K
Current: 7 mA
Magnetic field: 0.5T (DC)

H5
Size: 5 mm×5 mm×185 μm
Temperature: 287.8K
Current: 7 mA
Magnetic field: 0.3744T (AC 250 mHz)

Further, for H4, a variable-temperature measurement was performed as follows. The results are shown in Table 5.

Variable-Temperature Measurement

H4
Sample size: 5 mm×5 mm×117 μm (thickness)
Current: 7 mA
Magnetic field: 0.5T (AC, frequency 250 mHz)
Temperature range (290K-20K, 10 points, equidistant measurement at 1/T)

The measurement results are shown in FIG. 8 to FIG. 10.

Regarding the temperature dependence of the semiconductor characteristics, the Hall mobility and the carrier density increased as the temperature increased. On the other hand, the sheet resistance decreased. This temperature dependence matches with the temperature dependence of the conventional semiconductor characteristics. No phase transition was observed in the temperature range from room temperature to the helium temperature range. In a wide temperature range, cationic nitrogen was stable as a carrier.

TABLE 5

| | H3 | H4 | H5 |
|---|---|---|---|
| Hall mobility | 3.37[cm$^2$/V · s] | 3.23[cm$^2$/V · s] | 2.50[cm$^2$/V · s] |
| Carrier type | P-type | P-type | P-type |
| Carrier concentration | 9.02e18[1/cm$^3$] | 9.46e18[1/cm$^3$] | 8.59e18[1/cm$^3$] |

TABLE 5-continued

|  | H3 | H4 | H5 |
|---|---|---|---|
| Sheet resistance | 17.37[Ω/□] | 17.44[Ω/□] | 15.73[Ω/□] |
| Sample size | 4 mm × 4 mm × 118 μm (thickness) | 5 mm × 5 mm × 117 μm (thickness) | 5 mm × 5 mm × 185 μm (thickness) |
| Temperature | 290.2 K. | 290.5 K. | 287.8 K. |

From the Hall effect measurement results, it can be seen that the carrier type of the highly crystalline heterographene of the present invention is p-type and that its carrier density is $10^{18}$ cm$^{-3}$ or more. It is indicated that as a result of doping with cationic nitrogen, the planarity is able to be maintained, and holes, not electrons, are doped. The fact that the conventional nitrogen-doped graphene is n-type indicates that the proportion of cationic nitrogen is small in the conventional doped nitrogen and the planarity cannot be maintained. In addition, the fact that the Hall mobility, the carrier concentration, and the sheet resistance monotonously change from the helium temperature to the normal temperature indicates that the structural phase transition does not occur and the structure is stable in this temperature range.

[Visible UV Spectrum]

The visible UV spectrum of the thin film of the cast film obtained by dispersing the nitrogen-containing graphene powder (a) with a solvent on quartz and drying was measured. The results are shown in FIG. 11. This thin film exhibited the properties of a semiconductor containing nitrogen, and exhibited a transmittance of 80% or more in the visible region of 400 nm or more.

In the above, specific examples of the present invention were described in detail, but these are only illustrations and do not limit the scope of the claims. The invention disclosed herein may include various modifications and alterations of the specific examples described above.

REFERENCE SIGNS LIST 2 liquid (liquid phase)
4 solution plasma
5 container
6 electrode
7 stirring device
8 external power supply
9 insulating member
10 in-liquid plasma generator

The invention claimed is:

1. A heteroelement-containing graphene comprising carbon (C) and, as a heteroelement (X), nitrogen (N), having a structure in which heteroelements are introduced in place of carbon atoms in a sheet-like graphene structure composed mainly of carbon atoms and having a structure as illustrated in the following chemical structural Formula 2, and being a powder having an average particle size of 1 nm or more and 10 μm or less,
    wherein the amount of the heteroelement (X) is 10 atomic % or more and 30 atomic % or less,
    wherein spots belonging to either an orthorhombic system or a hexagonal system and having a symmetry of a single crystal are observed in selected area electron diffraction, and
    wherein the position of the heteroelement is disposed inside a planar structure of graphene,

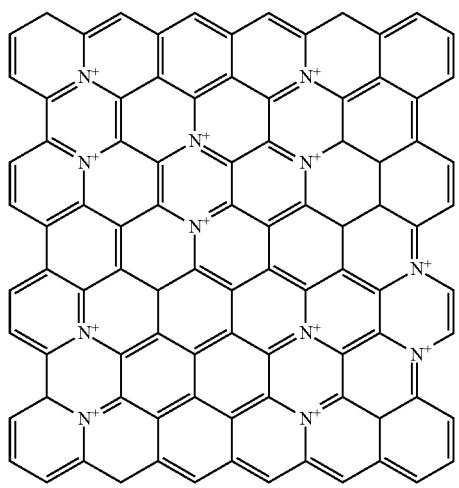

Formula 2

2. The heteroelement-containing graphene according to claim 1,
    wherein the spots form an electron diffraction image belonging to the orthorhombic system with an incident direction of [101], the spots including an array of reciprocal lattice points 11-1, −111, −202, 1-1-1, 20-2, and −1-11.

3. The heteroelement-containing graphene according to claim 1, wherein a half width of a diffraction peak from (002) planes is 3 degrees or less in X-ray diffraction.

4. The heteroelement-containing graphene according to claim 3, wherein a ratio (I(101)/I(002)) of a diffraction peak intensity I(101) from (101) planes to a diffraction peak intensity I(002) from (002) planes is 0.1 or more in X-ray diffraction.

5. The heteroelement-containing graphene according to claim 3, wherein an interplanar spacing between the (002) planes is 3.5 Å or less in X-ray diffraction.

6. The heteroelement-containing graphene according to claim 1, wherein an atomic ratio (X/C) of the heteroelement (X) to carbon (C), calculated based on X-ray photoelectron spectroscopy, is 0.1 or more.

7. The heteroelement-containing graphene according to claim 1, wherein a chemical bonding state of nitrogen doped to a basal plane is cationic nitrogen, and a carrier type of the heteroelement-containing graphene is p-type.

8. The heteroelement-containing graphene according to claim 1, wherein a ratio (I(D)/I(G)) of an intensity I(D) of a D band seen in the vicinity of 1350 cm$^{-1}$ to an intensity I(G) of a G band appearing in the vicinity of 1580 cm$^{-1}$ is 1 or less and a half width of the G band is 50 cm$^{-1}$ or less in Raman spectroscopic analysis with an excitation wavelength of 532 nm.

9. The heteroelement-containing graphene according to claim 1, wherein a ratio (I(2D)/I(G)) of an intensity I(2D) of a 2D band seen in the vicinity of 2700 cm$^{-1}$ to the intensity I(G) of the G band is 0.5 or more in the Raman spectroscopic analysis.

10. The heteroelement-containing graphene according to claim 1, wherein a half width of the 2D band seen in the vicinity of 2700 cm$^{-1}$ is 80 cm$^{-1}$ or less in the Raman spectroscopic analysis.

11. The heteroelement-containing graphene according to claim 1, which does not include a base material that supports the heteroelement-containing graphene.

12. The heteroelement-containing graphene according to claim 1, comprising a graphene sheet configured such that atoms of the carbon (C) are chemically bonded to atoms of the heteroelement (X) and atoms of the carbon (C) are principally sp$^2$-bonded to each other,
  wherein the graphene sheet has a single-layer structure formed by one layer or a stacked structure of two or more and five or less layers.

13. The heteroelement-containing graphene according to claim 2, wherein a half width of a diffraction peak from (002) planes is 3 degrees or less in X-ray diffraction.

14. The heteroelement-containing graphene according to claim 4, wherein an interplanar spacing between the (002) planes is 3.5 Å or less in X-ray diffraction.

15. The heteroelement-containing graphene according to claim 7, wherein the chemical bonding state of nitrogen being cationic nitrogen is indicated based on X-ray photoelectron spectroscopy, and the carrier type of the heteroelement-containing graphene being p-type is determined by Hall effect measurement.

* * * * *